(12) United States Patent
Kim et al.

(10) Patent No.: US 9,263,310 B2
(45) Date of Patent: Feb. 16, 2016

(54) SUBSTRATE TREATING APPARATUS AND SUBSTRATE TREATING METHOD

(75) Inventors: Sungho Kim, Seoul (KR); Choonsik Kim, Cheonan-si (KR); Yongtaek Eom, Hwaseong-si (KR); Hyuntaek Oh, Daejeon (KR); Hyungkeun Park, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 1118 days.

(21) Appl. No.: 13/164,868

(22) Filed: Jun. 21, 2011

(65) Prior Publication Data
US 2011/0312189 A1 Dec. 22, 2011

(30) Foreign Application Priority Data

Jun. 21, 2010 (KR) .................. 10-2010-0058788
May 31, 2011 (KR) .................. 10-2011-0052428
Jun. 16, 2011 (KR) .................. 10-2011-0058267

(51) Int. Cl.
*H01L 21/677* (2006.01)
*C23C 16/458* (2006.01)
*C23C 16/54* (2006.01)

(52) U.S. Cl.
CPC ...... *H01L 21/67736* (2013.01); *C23C 16/4583* (2013.01); *C23C 16/54* (2013.01); *H01L 21/67766* (2013.01); *H01L 21/67778* (2013.01)

(58) Field of Classification Search
CPC .............. H01L 21/67745; H01L 21/67775; H01L 21/67748; H01L 21/6776; H01L 21/67715
USPC .................. 414/217, 939, 150, 159
See application file for complete search history.

(56) References Cited

U.S. PATENT DOCUMENTS

| | | | |
|---|---|---|---|
| 2006/0251499 A1* | 11/2006 | Lunday et al. | 414/217 |
| 2006/0257233 A1* | 11/2006 | Bonora et al. | 414/217 |
| 2007/0144439 A1* | 6/2007 | Englhardt et al. | 118/719 |
| 2008/0101892 A1* | 5/2008 | Bonora et al. | 414/217 |

FOREIGN PATENT DOCUMENTS

| | | |
|---|---|---|
| CN | 1754795 A | 4/2006 |
| KR | 10-2008-0100057 A | 11/2008 |
| KR | 1020100132669 A | 12/2010 |
| KR | 10-2011-0009541 A | 1/2011 |
| KR | 20110036850 A | 4/2011 |
| TW | I279624 B | 4/2007 |

* cited by examiner

*Primary Examiner* — Saul Rodriguez
*Assistant Examiner* — Willie Berry, Jr.
(74) *Attorney, Agent, or Firm* — Carter, DeLuca, Farrell & Schmidt, LLP

(57) ABSTRACT

A substrate treating apparatus is provided. The substrate treating apparatus includes a loading/unloading unit, a process unit in which a substrate treating process is performed, a loadlock unit disposed between the loading/unloading unit and the process unit, and a carrying member transferring a substrate between the process unit and the loadlock unit. Herein, the carrying member is provided in the process unit and the loadlock unit, and the loading/unloading unit, the loadlock unit, and the process unit are sequentially disposed.

22 Claims, 28 Drawing Sheets

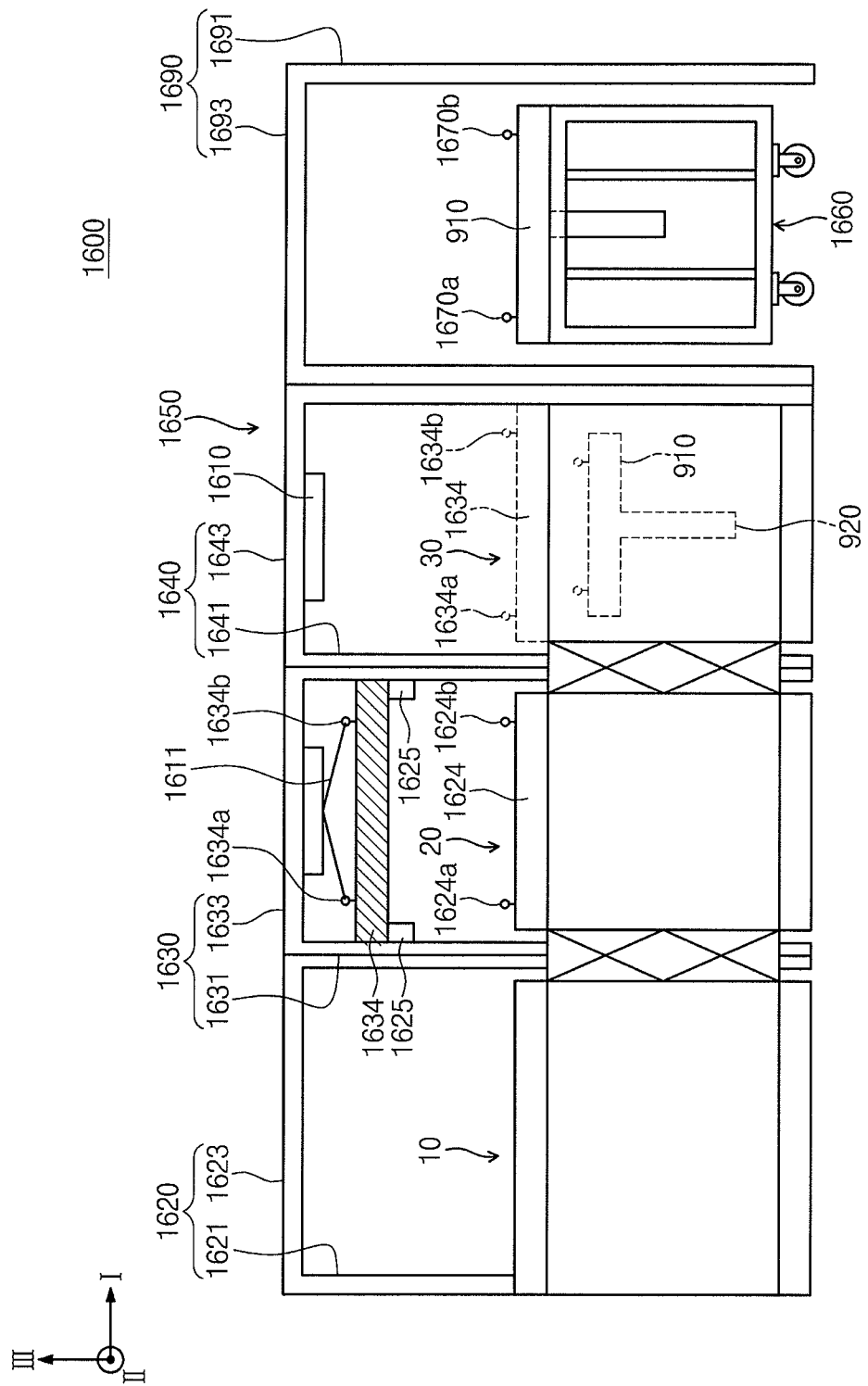

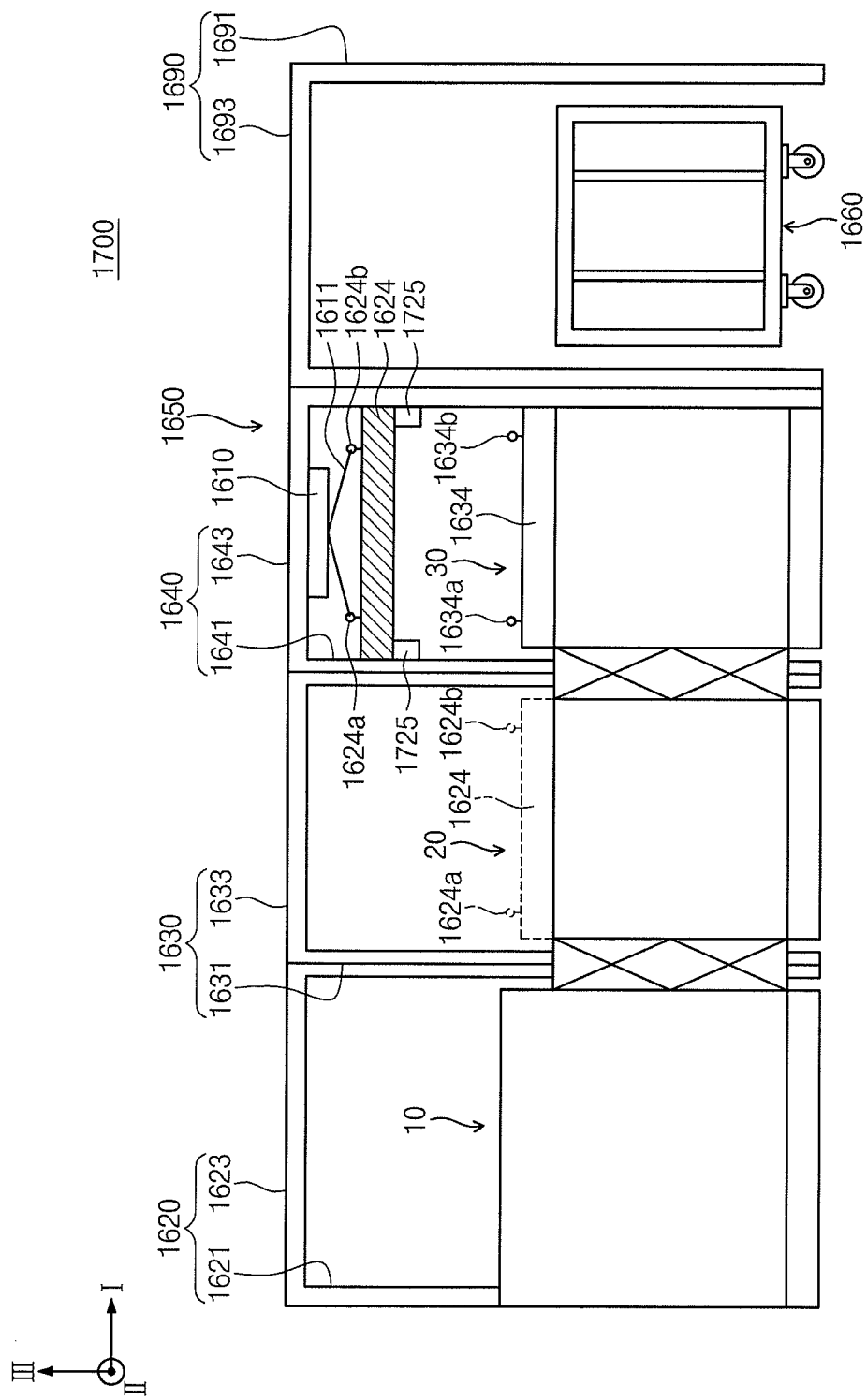

SUBSTRATE TREATING APPARATUS AND SUBSTRATE TREATING METHOD

CROSS-REFERENCE TO RELATED APPLICATIONS

This U.S. non-provisional patent application claims priority under 35 U.S.C. §119 of Korean Patent Application No. 10-2010-0058788, filed on Jun. 21, 2010, Korean Patent Application No. 10-2011-0052428, filed on May 31, 2011, and Korean Patent Application No. 10-2011-0058267, filed on Jun. 16, 2011 the entire contents of which are hereby incorporated by references.

BACKGROUND OF THE INVENTION

The present invention disclosed herein relates to a substrate treating apparatus and a substrate treating method, and more particularly, to a substrate treating apparatus depositing a thin film on a substrate by using plasma, and a substrate treating method using the same.

Solar cells are used to convert solar energy into electric energy by using semiconductors. Solar cells can be classified into: single crystalline silicon solar cells, polycrystalline solar cells, thin-film solar cells, etc.

Thin-film solar cells are manufactured by depositing p-, n-films on a transparent glass or plastic substrate, and crystalline solar cells are manufactured by depositing an antireflection film on a silicon substrate. Such films may be deposited on a substrate through a plasma enhanced chemical vapor deposition (PECVD) process.

SUMMARY OF THE INVENTION

Embodiments of the present invention provide a substrate treating apparatus in which a substrate is effectively transferred among a plurality of units.

Embodiments of the present invention also provide a substrate treating apparatus capable of performing maintenance effectively.

Embodiments of the present invention also provide a substrate treating apparatus of performing a process while transferring and carrying a substrate inside each unit.

Embodiments of the present invention provide substrate treating apparatuses, including: a loading/unloading unit; a process unit in which a substrate treating process is performed; a loadlock unit disposed between the loading/unloading unit and the process unit; and a carrying member transferring a substrate between the process unit and the loadlock unit, wherein the carrying member is provided in the process unit and the loadlock unit, and the loading/unloading unit, the loadlock unit, and the process unit are sequentially disposed.

In some embodiments, the carrying member may include: a first transfer unit provided in each of the loadlock unit and the process unit, the first transfer unit in the loadlock unit and the first transfer unit in the process unit having the same height; and a second transfer unit provided in each of the loadlock unit and the process unit, the second transfer unit in the loadlock unit and the second transfer unit in the process unit having the same height, wherein the second transfer unit is provided at a lower position than the first transfer unit.

In other embodiments, the first transfer unit may include: a first transfer module provided in a first treating room of the loadlock unit; and a loading module provided in the process unit and with the same height as the first transfer module. The second transfer unit may include: a second transfer module provided in a second treating room of the loadlock unit; and an unloading module provided in the process unit and with the same height as the second transfer module, wherein the first treating room and the second treating room are vertically partitioned in the loadlock unit.

In still other embodiments, the loading module may include: a first transfer member provided with the same height as the first transfer module; and a first driving member providing a driving force to the first transfer member. The unloading module may include: a second transfer member provided with the same height as the second transfer module; and a second driving member providing a driving force to the second transfer member.

In even other embodiments, the first transfer member may include: a driving shaft passing through a sidewall of a treating chamber of the process unit; a feeding roller provided to one end of the driving shaft to support a lower side of the substrate loaded into the treating chamber; a driven pulley provided to the other end of the driving shaft; and a sealing mechanism tightly coupled to an outer surface of the sidewall of the treating chamber and provided such that the driving shaft is inserted and is movable in a rotational or axial direction. The first driving member may include: a power transmission shaft; a driver provided to one end of the power transmission shaft to provide a rotational force; and a drive pulley provided to the other end of the power transmission shaft, wherein the driven pulley and the drive pulley are coupled to each other by a power transmission member such that the driving force generated from the first driving member is transmitted to the first transfer member.

In yet other embodiments, the second transfer member may include: a driving shaft passing through a sidewall of a treating chamber of the process unit; a feeding roller provided to one end of the driving shaft to support a lower side of the substrate unloaded from the treating chamber; and a driven pulley provided to the other end of the driving shaft. The second driving member may include: a driving shaft; a driver provided to one end of the driving shaft to provide a rotational force; and a drive pulley provided to the other end of the driving shaft, wherein the driven pulley and the drive pulley are connected by a power transmission member such that the driving force generated from the second driving member is transmitted to the second transfer member.

In further embodiments, the sealing mechanism may include a magnetic substance provided on an inner surface thereof, and a magnetic fluid provided between the magnetic substance and an outer surface of the driving shaft, and the magnetic fluid is magnetically induced by a magnetic force generated from the magnetic substance to seal a gap between the magnetic substance and the driving shaft.

In still further embodiments, the first transfer member may include: a movable plate disposed between the driven pulley and the sealing mechanism; a bearing member provided to the movable plate to rotatably support the driving shaft; and a driving section configured to move the movable plate in a horizontal direction.

In even further embodiments, the first driving member may include: a rotational shaft coupled to the driver; a connecting shaft connecting the rotational shaft and the power transmission shaft; a supporting plate into which the connecting shaft is rotatably inserted; and a driving section configured to move the supporting plate in the horizontal direction.

In yet further embodiments, the loadlock unit may further include a partition wall partitioning the loadlock unit into the first treating room and the second treating room.

In other embodiments the loadlock unit may further include: a first heater provided in the loadlock unit and disposed above the first transfer module; and a second heater disposed between the first transfer module and the second transfer module.

In still other embodiments, the process unit may include: a first process unit in which a first process is performed on the substrate; and a second process unit which is disposed adjacent to the first process unit, in which a second process is performed on the substrate, wherein the first process unit and the second process unit are sequentially disposed.

In even other embodiments, the loading/unloading unit may include: a tray carrying section carrying a tray in which the substrate is loaded or unloaded; a substrate loading conveyor section in which the substrates to be supplied to the tray are arranged in one row; a first substrate carrying robot picking up the substrate standing by in the substrate loading conveyor section to the tray positioned at the tray carrying section; and a second substrate carrying robot picking up the substrate from the tray positioned at the tray carrying section to carry the substrate picked up to the substrate unloading conveyor section.

In yet other embodiments, the substrate loading conveyor section and the substrate unloading conveyor section may be disposed symmetrically at both sides of the tray carrying section.

In further embodiments, the loading/unloading unit may further include a cassette loading conveyor section including an upper conveyor and a lower conveyor, wherein a cassette containing the substrate to be carried to the substrate loading conveyor section is placed on the upper conveyor, and the cassette from which the substrate has been unloaded to the substrate loading conveyor section is placed on the lower conveyor.

In still further embodiments, the first substrate carrying robot may include: a pair of transfer rails installed at both sides of an upper portion of the tray carrying section; a movable frame movably provided in a direction along the transfer rails in one pair; and a chuck unit installed in the movable frame.

In even further embodiments, the chuck unit may include: a Bernoulli chuck holding an upper surface of the substrate in a non-contact state; a supporting frame in which the Bernoulli chuck is installed; and an elevation driver moving the supporting frame up and down.

In yet further embodiments, the loading/unloading unit may further include a substrate carrying section provided between the cassette loading conveyor section and the substrate loading conveyor section to carry the substrate from the cassette loading conveyor section to the substrate loading conveyor section. Herein, the substrate carrying section may include: a base plate; an end effector installed in the base plate and moving forwardly or backwardly in a direction which the substrate is carried; and a substrate shift module installed in the base plate to carry the substrate carried by the end effector to a conveyor of the substrate loading conveyor section.

In other embodiments, a vacuum holder adsorbing the substrate may be provided to an end of the end effector.

In still other embodiments, the tray carrying section may include: an upper feeding roller disposed apart from the tray in parallel to a carrying direction of the tray to carry the tray carried into the loadlock unit; a lower feeding roller disposed apart from the tray in parallel to the carrying direction of the tray under the upper feeding roller to carry the tray carried out of the loadlock unit; an open driving section moving the upper feeding roller in a horizontal direction; and a tray lifter lifting the tray placed on the lower feeding roller.

In even other embodiments, the substrate treating apparatus may further include: a crane unit provided to an upper side of the loading/unloading unit, the loadlock unit, or the process unit; a frame section supporting the crane unit; and a driving unit installed in the frame unit to drive the crane unit, wherein the crane unit is provided for maintenance of the loading/unloading unit, the loadlock unit, or the process unit.

In yet other embodiments, the frame section may include: a first frame section disposed above the loading/unloading unit; a second frame section disposed above the loadlock unit; a third frame section disposed above the process unit; and a holding section provided to either the first frame section or the second frame section, on which either a process unit lead opening/closing the process unit or a loadlock unit lead opening/closing the loadlock unit is placed.

In further embodiments, the process unit lead, the loadlock unit lead, or a holding unit holding a supporting unit separated from the process unit may be further disposed in the fourth frame section.

In still further embodiments, the holding unit may include: a body section; a hole formed downwardly from an upper surface of the body section; and a moving means coupled to an undersurface of the body section.

In even further embodiments, the body section may include: an upper frame contacting and supporting the supporting unit at a lower side of the supporting unit; side frames vertically extending in a downward direction from edges of the upper frame; and a lower frame provided in parallel with the upper frame at lower ends of the side frames.

In other embodiments of the present invention, substrate treating methods include: transferring a substrate to be treated to a process unit from a loadlock unit to the process unit through a first transfer path, and transferring the substrate treated in the process unit to the loadlock unit from the process unit to the loadlock unit through a second transfer path, wherein the first transfer path and the second transfer path are all provided in the loadlock unit and the process unit.

In some embodiments, the process unit may include: a first process unit performing a first process with respect to the substrate; and a second process unit performing a second process with respect to the substrate which has been subject to the first process, wherein the first transfer path is a path through which the substrate to be treated is transferred to the second process unit while sequentially passing through the loadlock unit and the first process unit, and the second transfer path is a path through which the treated substrate is transferred to the loadlock unit while sequentially passing through the second process unit and the first process unit.

In other embodiments, in the first transfer path, the substrate may be transferred through a first transfer unit which is provided with the same height in each of the loadlock unit and the process unit, and, in the second transfer path, the substrate may be transferred through a second transfer unit which is provided with the same height in each of the loadlock unit and the process unit and is provided at a lower position than the first transfer unit.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 16A illustrates a layout according to another example of the substrate treating apparatus of FIG. 15;

FIG. 17A illustrates a layout according to another example of the substrate treating apparatus of FIG. 16A;

DETAILED DESCRIPTION OF PREFERRED EMBODIMENTS

A substrate treating apparatus according to an embodiment of the present invention will be described below in more detail with reference to the accompanying drawings. Detailed descriptions related to well-known functions or configurations will be ruled out in order not to unnecessarily obscure subject matters of the present invention.

Figure 1:
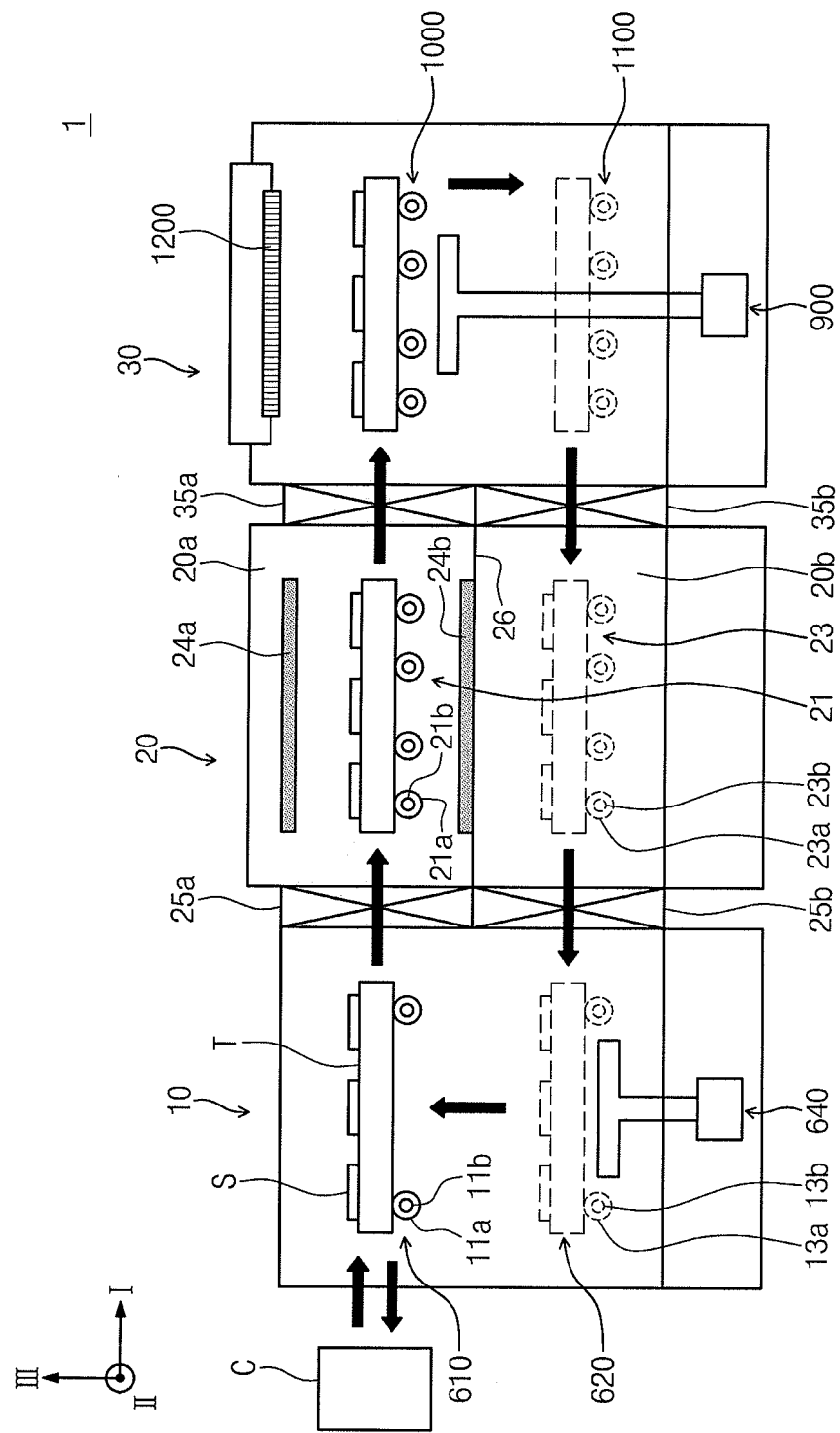
FIG. 1 illustrates a layout of a substrate treating apparatus according to an embodiment of the present invention.

FIG. 1 illustrates a layout of a substrate treating apparatus 1 according to an embodiment of the present invention.

The substrate treating apparatus 1 includes a loading/unloading unit 10, a loadlock unit 20, and a process unit 30. The loading/unloading unit 10 loads substrates (S) on a tray (T), or unloads substrates (S) from the tray (T). The loadlock unit 20 carries a tray (T) between the loading/unloading unit 10 in an atmospheric state and the process unit 30 in a vacuum state. In the process unit 30, a deposition process is performed on a substrate (S) in a vacuum state to form thin films such as p-type or n-type semiconductor layers, anti-reflection layers, and electrodes on the substrate (S). The loading/unloading unit 10, the loadlock unit 20 and the process unit 30 are sequentially arranged in series. Hereinafter, the arrangement direction of the loading/unloading unit 10, the loadlock unit 20 and the process unit 30 is referred to as a first direction (I); a direction perpendicular to the first direction (I) when viewed from an upper side is referred to as a second direction (II); and a direction perpendicular to both of the first direction (I) and the second direction (II) is referred to as a third direction (III). In Claims, a first transfer module 21 and a loading module 1000 may be collectively described as a first transfer unit, and a second transfer module 23 and an unloading module 1100 may be collectively described as a second transfer unit. Also, the first transfer unit and the second transfer unit may be described as a carrying member. A tray (T) containing substrates (S) is transferred in a sequence of a carrying section 610, the first transfer module 21, the loading module 1000, the unloading module 1100, a second transfer module 23, and a carrying section 620.

Figure 2:
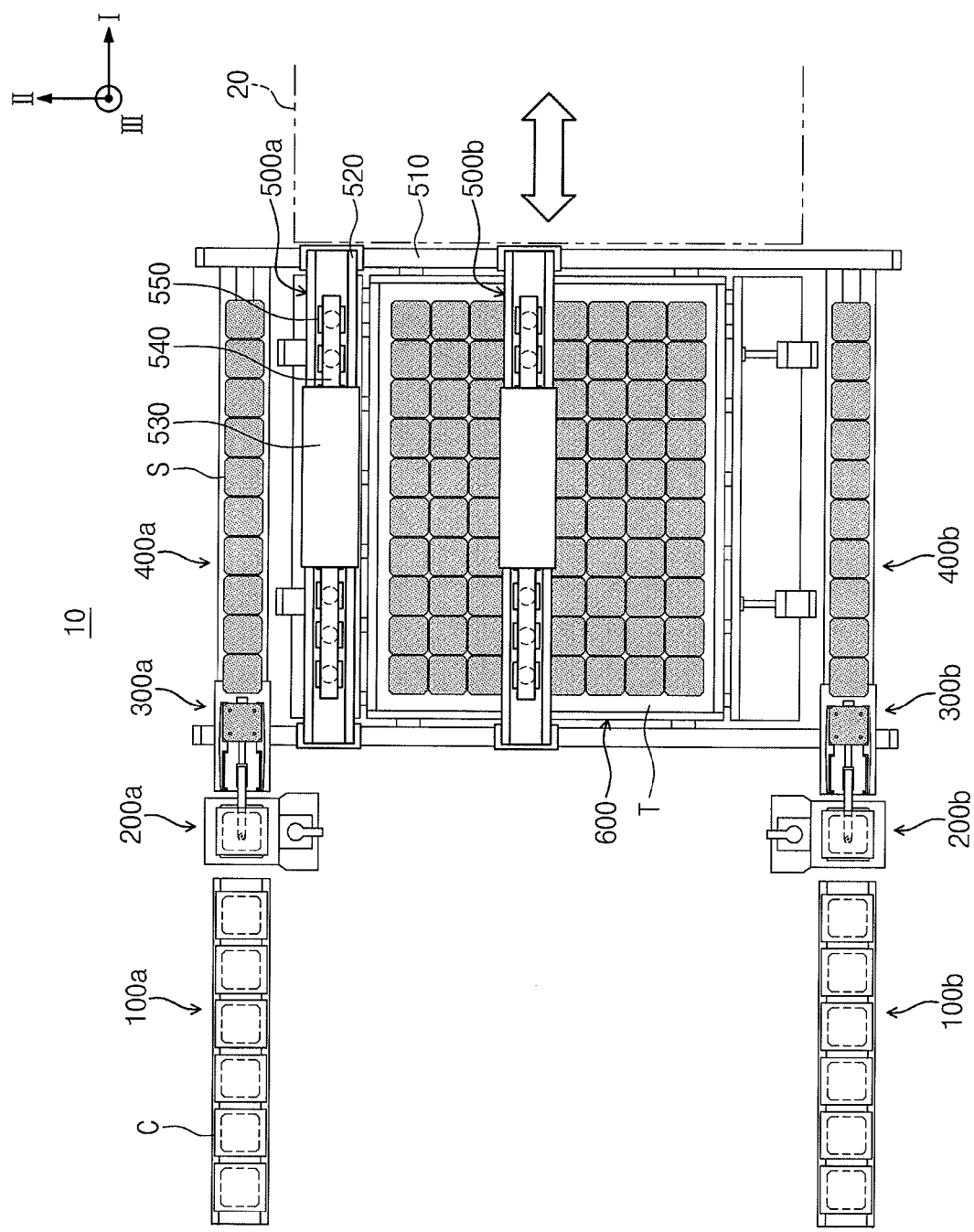
FIG. 2 is a plan view illustrating a layout of a loading/unloading unit of FIG. 1.

FIG. 2 is a plan view illustrating a layout of the loading/unloading unit 10 of FIG. 1.

Referring to FIGS. 1 and 2, the loading/unloading unit 10 includes a cassette loading conveyor section 100a, a first cassette elevator 200a, a substrate carrying-in section 300a, a substrate loading conveyor section 400a, a first substrate carrying robot 500a, a tray carrying section 600, a cassette unloading conveyor section 100b, a second cassette elevator 200b, a substrate carrying-out section 300b, a substrate unloading conveyor section 400b, and a second substrate carrying robot 500b.

Figure 3:
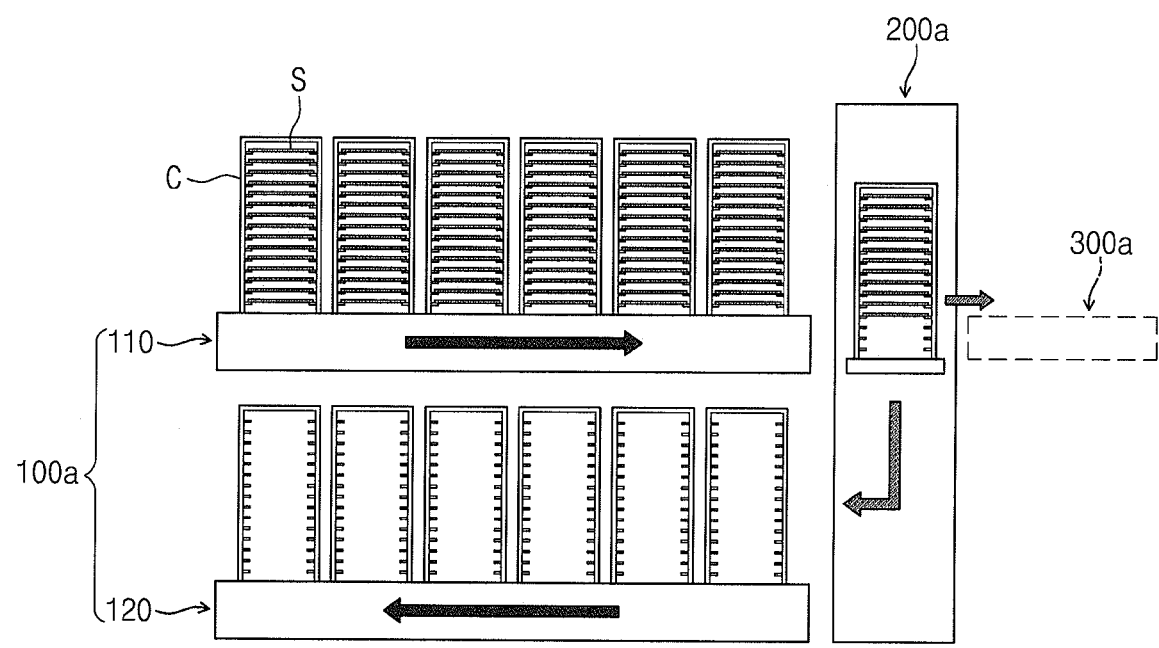
FIG. 3 illustrates a cassette loading conveyor section of FIG. 2.

FIG. 3 illustrates the cassette loading conveyor section 100a of FIG. 2.

Referring to FIGS. 2 and 3, the cassette loading conveyor section 100a includes an upper conveyor 110 and a lower conveyor 120. Cassettes (C) with substrates (S) stacked are placed on the upper conveyor 110. Empty cassettes (C) are placed on the lower conveyor 120. The cassette (C) may be described as a substrate containing member. The upper conveyor 110 supplies cassettes (C) containing substrates (S) to be processed to the first cassette elevator 200a. The lower conveyor 120 receives the empty cassettes (C) from the first cassette elevator 200a. The cassette unloading conveyor section 100b supplies the empty cassettes (C) to the second cassette elevator 200b, and receives a cassette (C) containing processed substrates (S) from the second cassette elevator 200b. The cassette unloading conveyor section 100b may have the same structure as the cassette loading conveyor section 100a.

The first cassette elevator 200a operates in association with the substrate carrying-in section 300a to elevate a cassette (C) when a substrate (S) is carried out from the cassette (C) at the substrate carrying-in section 300a. The second cassette elevator 200b operates in association with the substrate carrying-out section 300b to elevate a cassette (C) when a substrate (S) is carried into the cassette (C) at the substrate carrying-out section 300b. The second cassette elevator 200b has the same structure as the first cassette elevator 200a.

The substrate carrying-in section 300a has the same structure as the substrate carrying-out section 300b. The substrate carrying-in section 300a takes out a substrate (S) from a cassette (C) and provides the substrate (S) to the substrate loading conveyor section 400a. The substrate carrying-out section 300b performs an operation opposite to the substrate carrying-in section 300a. That is, the substrate carrying-out section 300b brings a substrate (S) from the substrate unloading conveyor section 400b and provides the substrate (S) to the cassette (C).

Figure 4A:
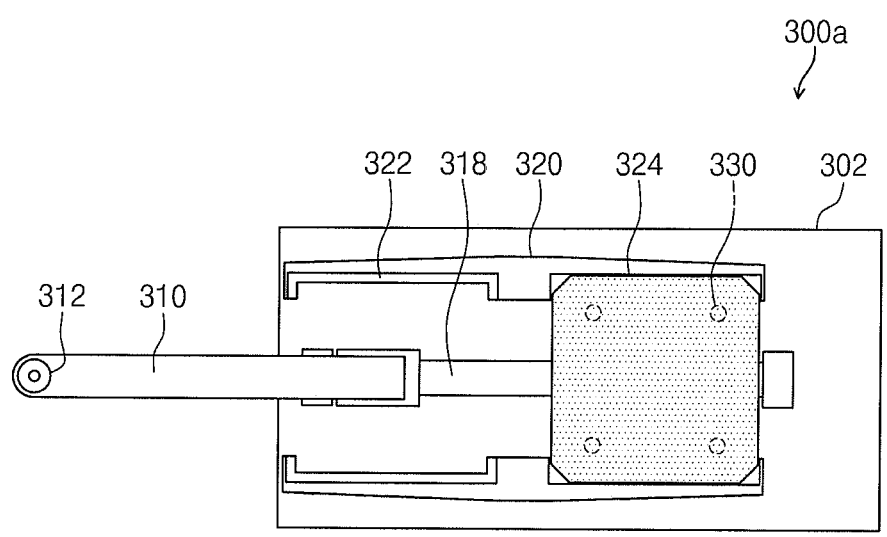
FIG. 4A illustrates a substrate carrying-in section of FIG. 2.
Figure 4B:
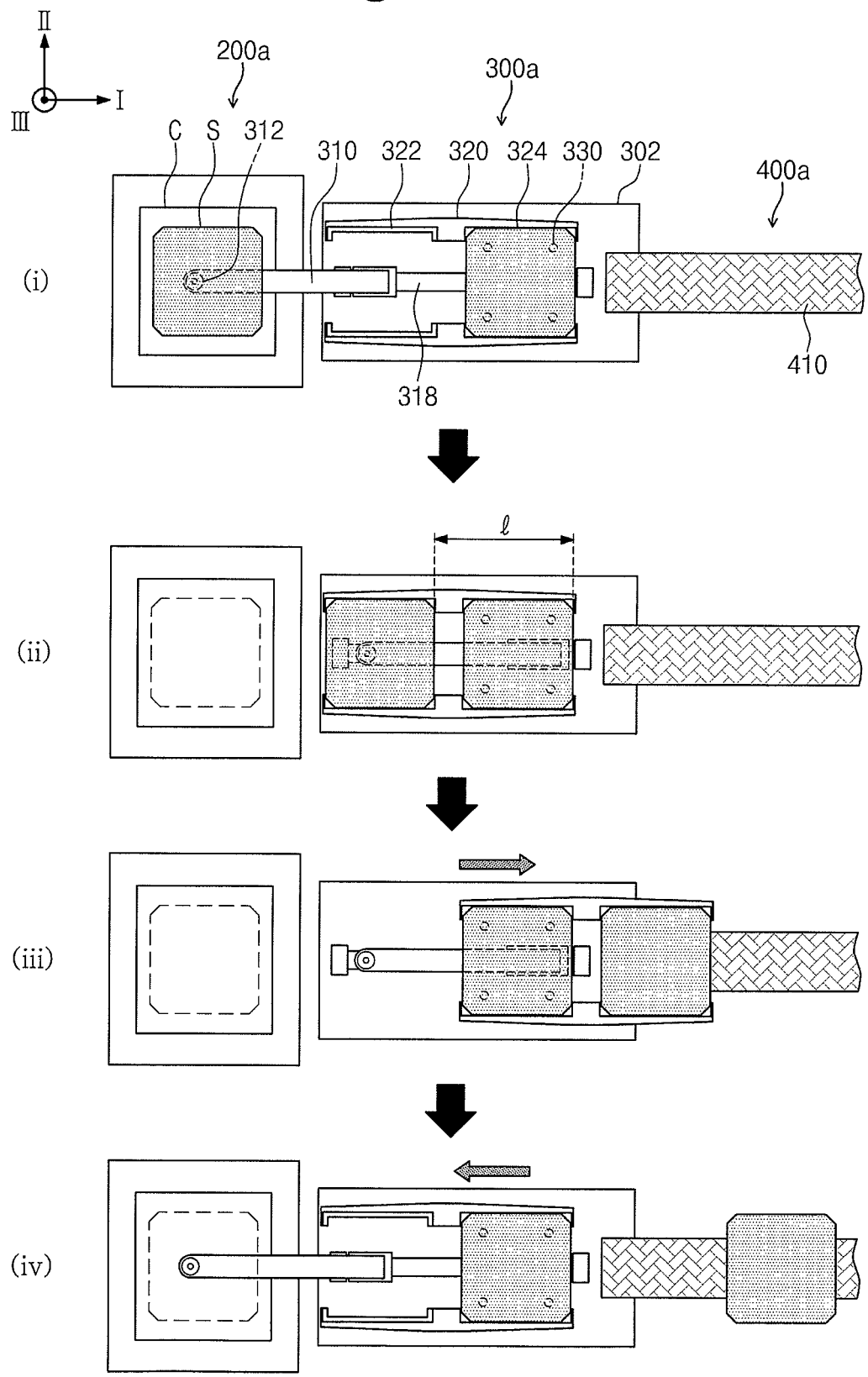
FIG. 4B illustrates how a substrate is carried in the substrate carrying-in section.

FIG. 4A illustrates the substrate carrying-in section 300a of FIG. 2. FIG. 4B illustrates how a substrate is carried in the substrate carrying-in section 300a.

Referring to FIGS. 2 and 4A, the substrate carrying-in section 300a includes a base plate 302, an end effector 310, and a substrate shift module 320.

The end effector 310 is installed on the base plate 302. The end effector 310 moves forward and backward in the first direction (I) by a cylinder unit 318. The end effector 310 includes a vacuum holder 312 at an end thereof so as to vacuum-hold a substrate (S). When the end effector 310 moves in one way of the first direction (I) (hereinafter, referred to as a forward direction), the vacuum holder 312 is positioned inside the cassette (C) provided on the first cassette elevator 200a (see FIG. 4B(i)). As the end effector 310 moves forward, the first cassette elevator 200a moves down by a predetermined length so as to allow a substrate (S) to be placed on the vacuum holder 312 of the end effector 310. That is, as the first cassette elevator 200a moves down, one of substrates (S) contained in the cassette (C) is vacuum-held by the vacuum holder 312 of the end effector 310. The end effector 310 moves in the other way of the first direction (I) (hereinafter, referred to as a backward direction) while vacuum-holding the substrate (see FIG. 4B(ii)). When the end effector 310 moves backward, the substrate (S) held by the end effector 310 is placed on a first seat 322 of the substrate shift module 320.

The substrate shift module 320 is installed on the base plate 302. The substrate shift module 320 includes first and second seats 322 and 324. The first and second seats 322 and 324 are symmetrically arranged and integrally formed. The substrate shift module 320 moves up and down in the third direction (III). The substrate shift module 320 places a substrate (S), which is positioned on the first seat 322, on substrate support pins 330 located inside the second seat 324. The substrate shift module 320 transfers the substrate (S) supported by the substrate support pins 330 onto a conveyor 410 of the substrate loading conveyor section 400a. The movement of the substrate shift module 320 may be realized by a typical linear driving means such as a cylinder unit and a motor driving unit.

Referring to FIG. 4B again, a substrate (S) contained in a cassette (C) is vacuum-held on the vacuum holder 312 by the forward movement of the end effector 310 and the up- and down-movement of the first cassette elevator 200a (see FIG. 4B(i)). When the end effector 310 moves backward, the substrate (S) is placed on the first seat 322 of the substrate shift module 320 (see FIG. 4B(ii)). At this time, the substrate shift module 320 is placed at a standby position lower than the substrate (S) placed on the end effector 310 and a substrate support height of the substrate support pins 330. Next, the substrate shift module 320 is elevated to move the substrate (S) from the end effector 310 to the first seat 322 of the substrate shift module 320. At this time, the substrate shift module 320 is elevated to a position higher than the substrate (S) placed on the end effector 310 and also higher than the substrate support height of the substrate support pins 330. In addition, a standby substrate (S) supported by the substrate support pins 330 is placed on the second seat 324 of the substrate shift module 320. Next, the substrate shift module 320 moves backward by a shift distance to transfer the substrate (S) placed on the first seat 322 to an upper region of the substrate support pins 330, and the standby substrate (S) placed on the second seat 324 to an upper region of the substrate loading conveyor section 400a (see FIG. 4B(iii)). Thereafter, the substrate shift module 320 moves downward to place the substrate (S) on the substrate support pins 330 and to place the standby substrate (S) on the conveyor 410 of the substrate loading conveyor section 400a. Afterwards, when a substrate (S) is placed on the substrate loading conveyor section 400a, the conveyor 410 is shifted backward to receive a next substrate (S) (see FIG. 4B(iv)). The substrate shift module 320 is shifted to an original standby position (original position). Then, the end effector 310 operates again in the same way so as to pick up another substrate (S) from the cassette (C) and place the substrate (S) on the first seat 322. As the substrate carrying-out section 300a operates several times in this way, ten substrates are arranged in a line on the conveyor 410 of the substrate loading conveyor section 400a.

Referring to FIG. 2 again, the first substrate carrying robot 500a is a carrying device for unloading ten substrates (substrates before processed) placed on the conveyor 410 of the substrate loading conveyor section 400a at a time and loading them on a tray (T). The second substrate carrying robot 500b is a carrying device for holding (unloading) processed substrates (S) in units of a line from the tray (T) at a time and loading (carrying) the processed substrates (S) on the conveyor of the substrate unloading conveyor section 400b. The first substrate carrying robot 500a and the second substrate carrying robot 500b have the same structure. Herebelow, the first substrate carrying robot 500a will be described.

Figure 5:
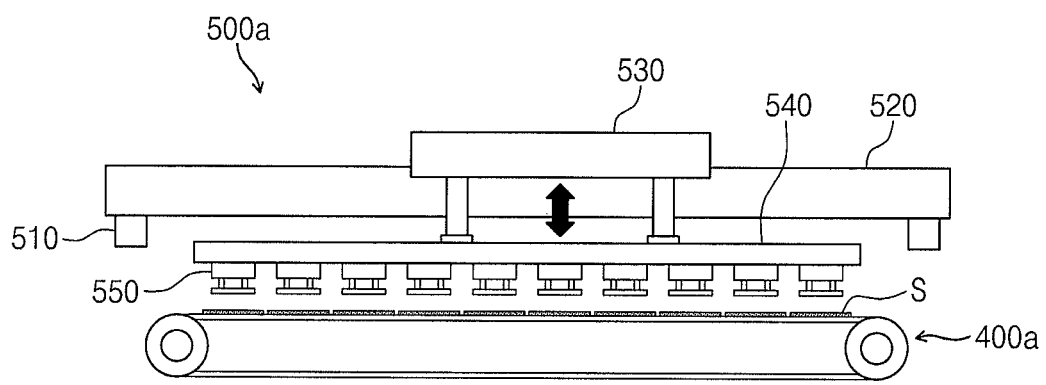
FIG. 5 illustrates the constitution of a first substrate carrying robot.

FIG. 5 illustrates the constitution of the first substrate carrying robot 500a.

Referring to FIGS. 2 and 5, the first substrate carrying robot 500a includes a transfer rail 510, a movable frame 520, and a chuck unit. The transfer rail 510 is disposed at both sides above the tray carrying section 600. The movable frame 520 is movably installed to move along the transfer rail 510 in the second direction (II). The chuck unit is installed on the movable frame 520. The chuck unit includes a Bernoulli chuck 550, a support frame 540, and an elevation driver 530. The Bernoulli chuck 550 holds the top surface of a substrate in a non-contact manner by Bernoulli's principle. Herein, the number of Bernoulli chucks 550 provided herein may be ten. The Bernoulli chucks 550 are mounted on the support frame 540. The elevation driver 530 allows the support frame 540 to move up and down in the third direction (III).

FIG. 6A through 6E illustrate how a tray moves from a lower carrying section to an upper carrying section.

Figure 6A:
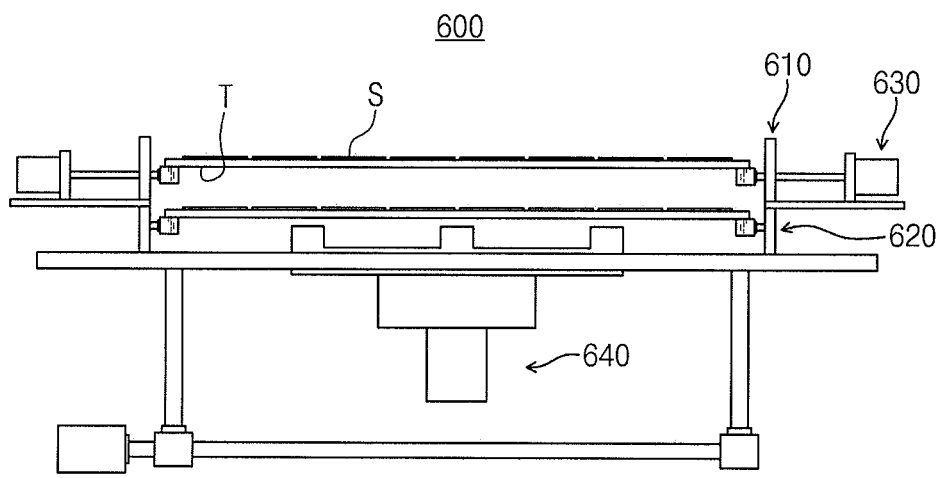
FIG. 6A through 6E illustrate how a tray moves from a lower carrying section to an upper carrying section.
Figure 6B:
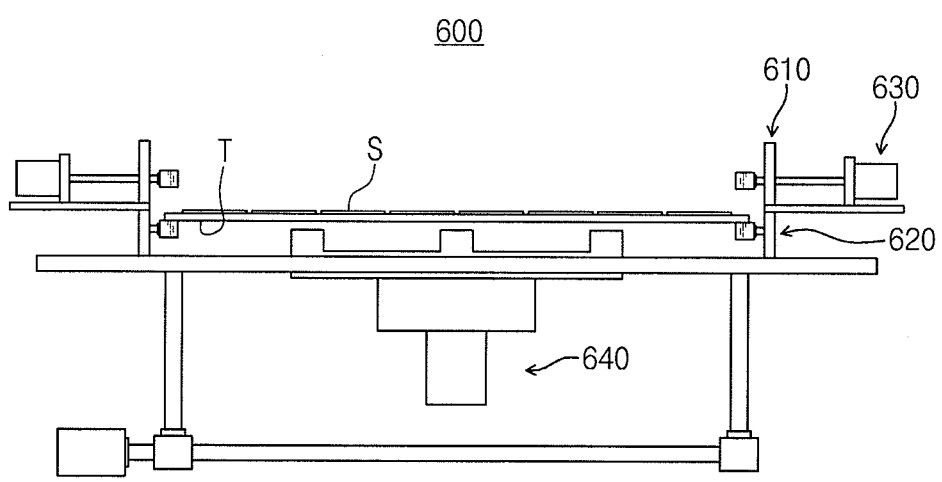
Figure 6C:
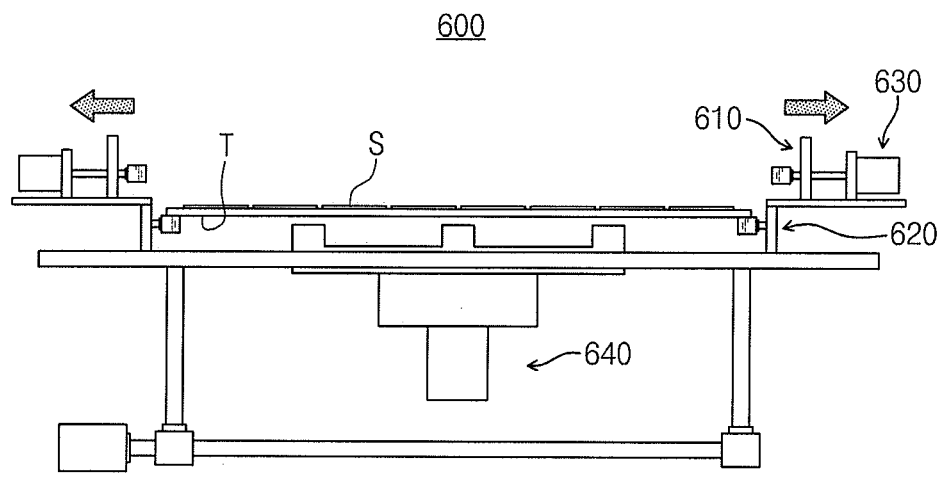
Figure 6D:
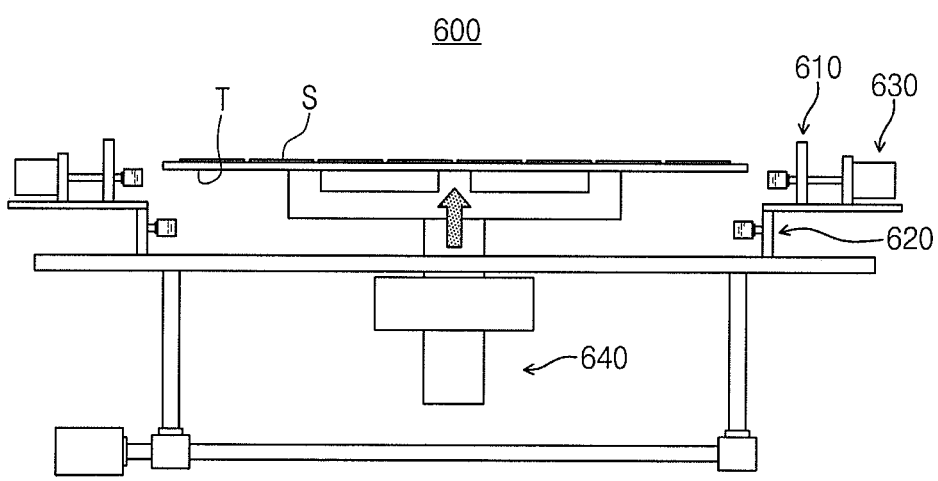
Figure 6E:
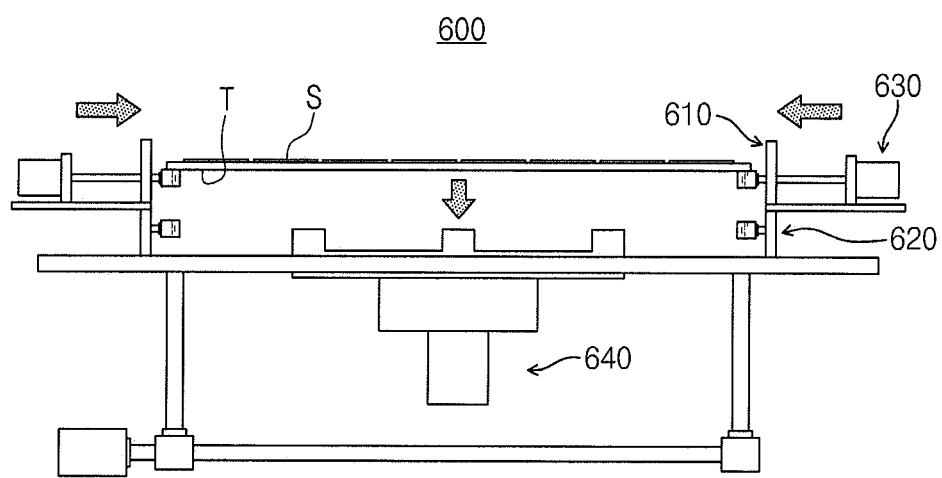

The tray carrying section 600 transfers a tray (T) to the loadlock unit 20 or receives the tray (T) from the loadlock unit 20. Referring to FIGS. 2 and 6A, the tray carrying section 600 includes carrying sections 610 and 620, an open driving section 630, and a tray lifter 640.

The carrying sections 610 and 620 are disposed at both sides in the first direction (1) parallel with the carrying direction of the tray (T). The open driving section 630 allows the upper carrying section 610 to move in the second direction (II). The tray lifter 640 lifts up the tray placed on the lower carrying section 620. The lower carrying section 620 transfers the tray carried out from the loadlock chamber 20. The upper carrying section 610 transfers the tray carried into the loadlock chamber 20. The upper carrying section 610 has a roller (see 11a in FIG. 1) and a rotating shaft (see 11b in FIG. 1). Likewise, the lower carrying section 620 has a roller (see 13a in FIG. 1) and a rotating shaft (see 13b in FIG. 1). The carrying sections 610 and 620 are driven by a roller driving means (not shown).

Referring to FIGS. 6A through 6E, description will be given of how a tray moves from the lower carrying section 620 to the upper carrying section 610.

After substrates (S) of the tray (T) placed on the upper carrying section 610 are replaced (see FIG. 6A), the upper carrying section 610 carries the tray to the loadlock chamber (see 20 in FIG. 1). Then, no tray is placed on the upper carrying section 610 (see FIG. 6B). Thereafter, the upper carrying section 610 moves forward and backward in the second direction (II) by the open driving section 630 to thereby provide a space sufficient for a standby tray placed on the lower carrying section 620 to be lifted (see FIG. 6C). The tray lifter 640 lifts the standby tray placed on the lower carrying section 620 (see FIG. 6D). After the standby tray (T) is lifted, the upper carrying section 610 moves to the original position by the open driving section 630. Then, the tray lifter 640 moves downward to transfer the tray supported by the tray lifter 640 to the upper carrying section 610 (see FIG. 6E).

Referring to FIG. 2 again, description will be given of how substrates are loaded on and unloaded from the loading/unloading unit.

The second substrate carrying robot 500b picks up ten substrates (S) arrayed in a first row of a tray (T) placed on the upper carrying section 610 of the tray carrying section 600, and then transfers the picked-up substrates (S) to the substrate unloading conveyor section 400b. Along with this, the first substrate carrying robot 500a operates in association with the substrate unloading operation of the second substrate carrying robot 500b to pick up ten substrates (S) placed on the substrate loading conveyor section 400a (at the time when the second substrate carrying robot 500b picks up the first row of substrates (S) from the tray), and then the first substrate carrying robot 500a carries the substrates (S) to the first row of the tray which is emptied by the substrate unloading operation of the second substrate carrying robot 500b. In this way, the first and second substrate carrying robots 500a and 500b can be simultaneously operated to load and unload substrates (S). Alternatively, the first and second substrate carrying robots 500a and 500b may be individually operated to load and unload substrates (S).

Referring to FIG. 1 again, the loadlock unit 20 is disposed between the loading/unloading unit 10 and the process unit 30. The loadlock unit 20 has a partition wall 26 therein. The partition wall 26 is disposed in a direction perpendicular to the third direction (III). The partition wall 26 partitions the loadlock unit 20 into a first treating room 20a and a second treating room 20b. Between the first treating room 20a and the loading/unloading unit 10, and between the second treating room 20b and the loading/unloading unit 10, there is provided a moving path (not shown) of the tray (T) containing substrates (S). The moving path is opened and closed by gate valves 25a and 25b. Likewise, between the first treating room 20a and the process unit 30, and between the second treating room 20b and the process unit 30, there is provided a moving path (not shown) of the tray (T) containing substrates (S). The moving path is opened and closed by gate valves 35a and 35b.

The first transfer module 21 is provided in the first treating room 20a of the loadlock unit 20. The first transfer module 21 includes a roller 21a, a rotating shaft 21b, and a driving unit (not shown) configured to rotate the rotating shaft 21b. The first transfer module 21 receives a tray (T) containing substrates (S) from the carrying section 610 of the loading/unloading unit 10, and transports the tray (T) to the loading module 1000 of the process unit 30.

The second transfer module 23 is provided in the second treating room 20b of the loadlock unit 20. The second transfer module 23 includes a roller 23a, a rotating shaft 23b, and a driving unit (not shown) configured to rotate the rotating shaft 23b. The second transfer module 23 receives a tray (T) containing substrates (S) from the unloading unit 1100 of the process unit 30, and transports the tray (T) to the carrying section 620 of the loading/unloading unit 10 Heaters 24a and 24b are provided above and below the first transfer module 21 in the first treating room 20a. When the tray (T) containing substrates (S) are transported to the first transfer module 21 of the loadlock unit 20 from the carrying section 610 of the loading/unloading unit 10, the internal condition of the first treating room 20a is changed to have the same temperature and processing pressure as those of the process unit 30 in the closed state of the gate valves 25a and 35a. Thereafter, when the gate valve 35a is opened, the first transfer module 21 in the first treating room 20a transports a tray (T) to the loading module 1000 of the process unit 30. When a tray (T) containing processed substrates (S) are transferred into the second treating room 20b of the loadlock unit 20 from the process unit 30, the internal condition of the second treating room 20b is changed to have the same temperature (room temperature) and pressure (atmosphere) as those of the loading/unloading unit 10 in the closed state of the gate valves 25b and 35b. Afterwards, when the gate valve 25b is opened, the second transfer module 23 in the second treating room 20b transports the tray (T) to the carrying section 620 of the loading/unloading unit 10.

Figure 7A:
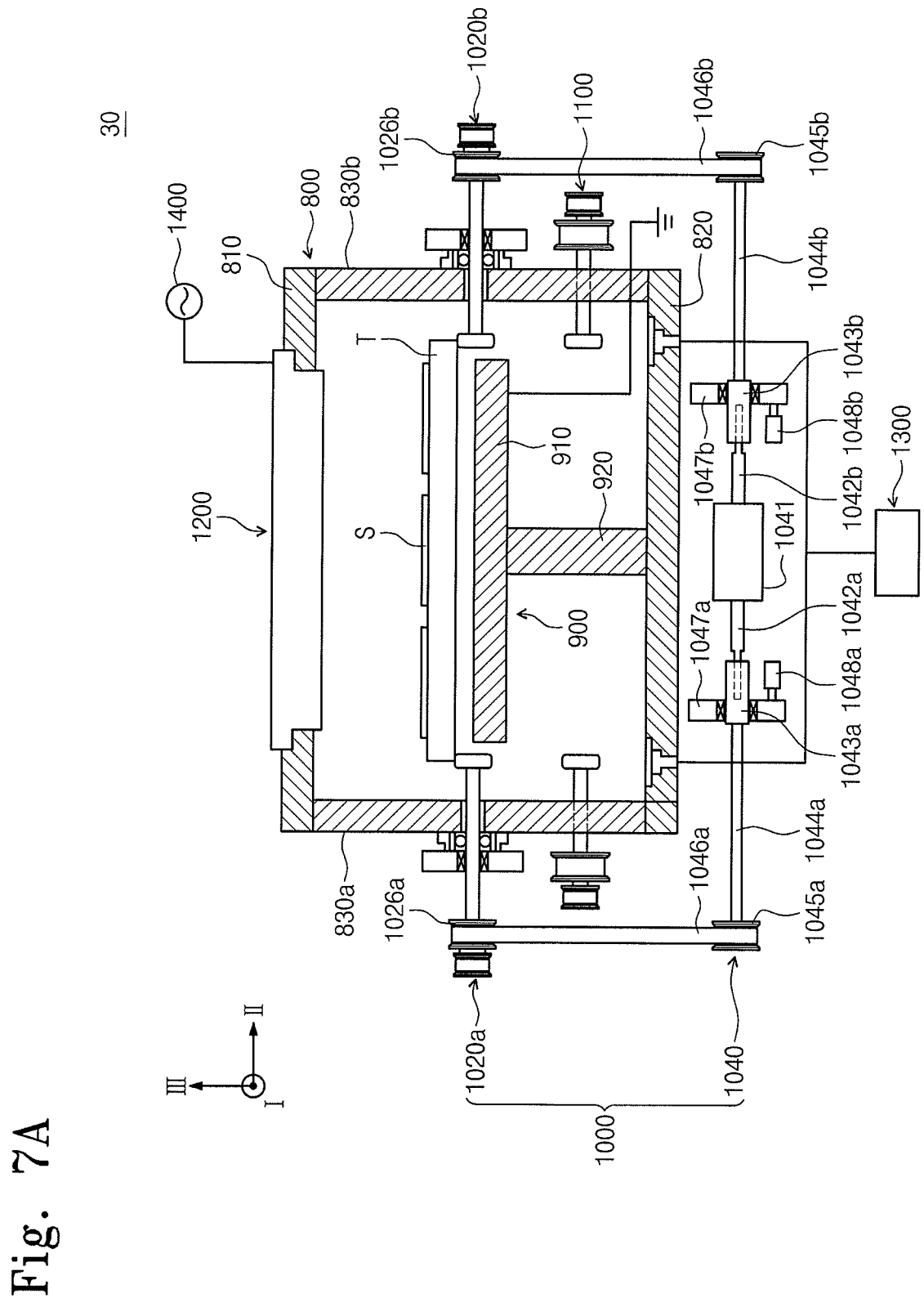
FIG. 7A is a cross-sectional side view of a process unit of FIG. 1.
Figure 7B:
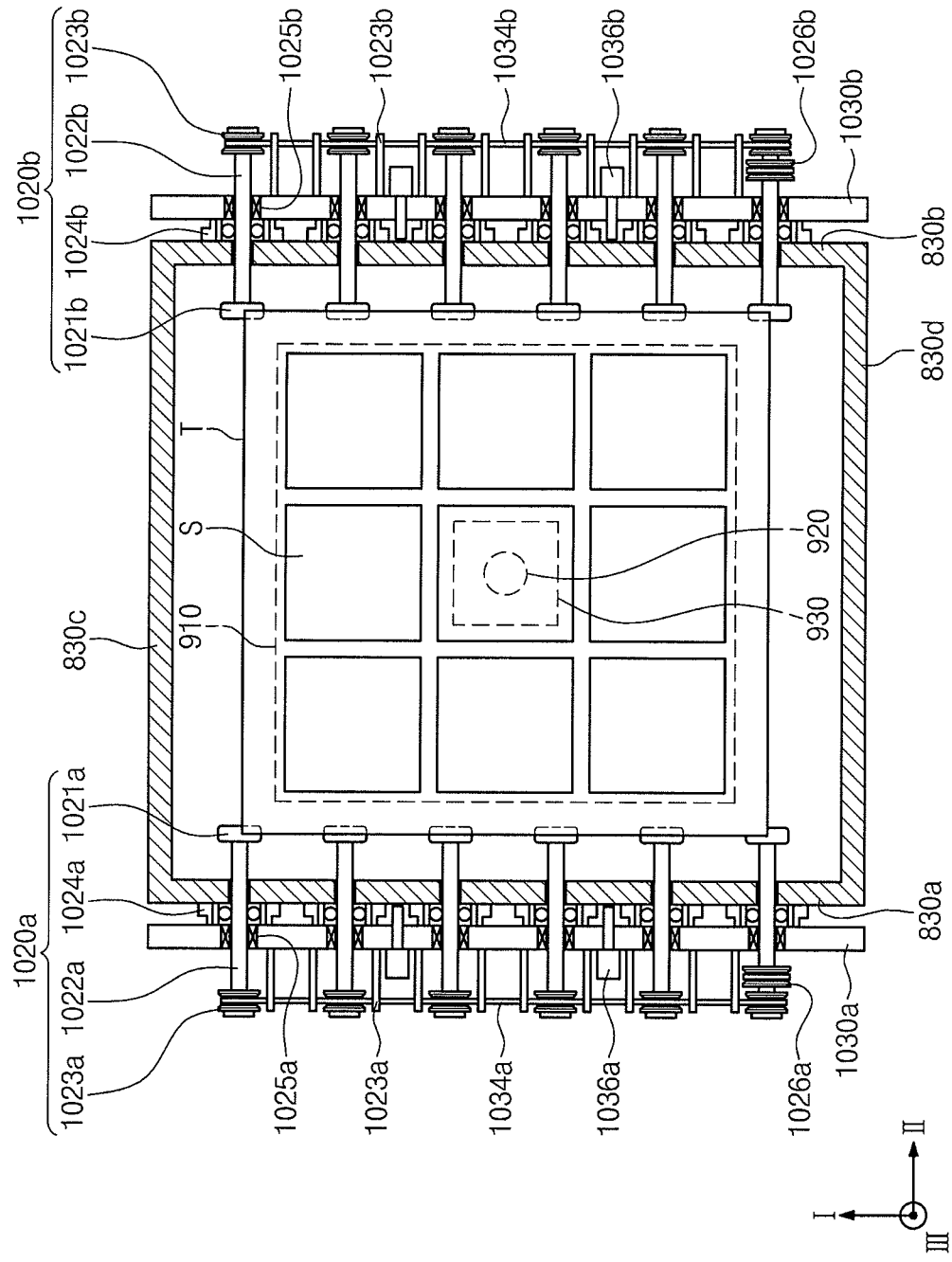
FIG. 7B is a cross-sectional plan view of the process unit of FIG. 1.
Figure 7C:
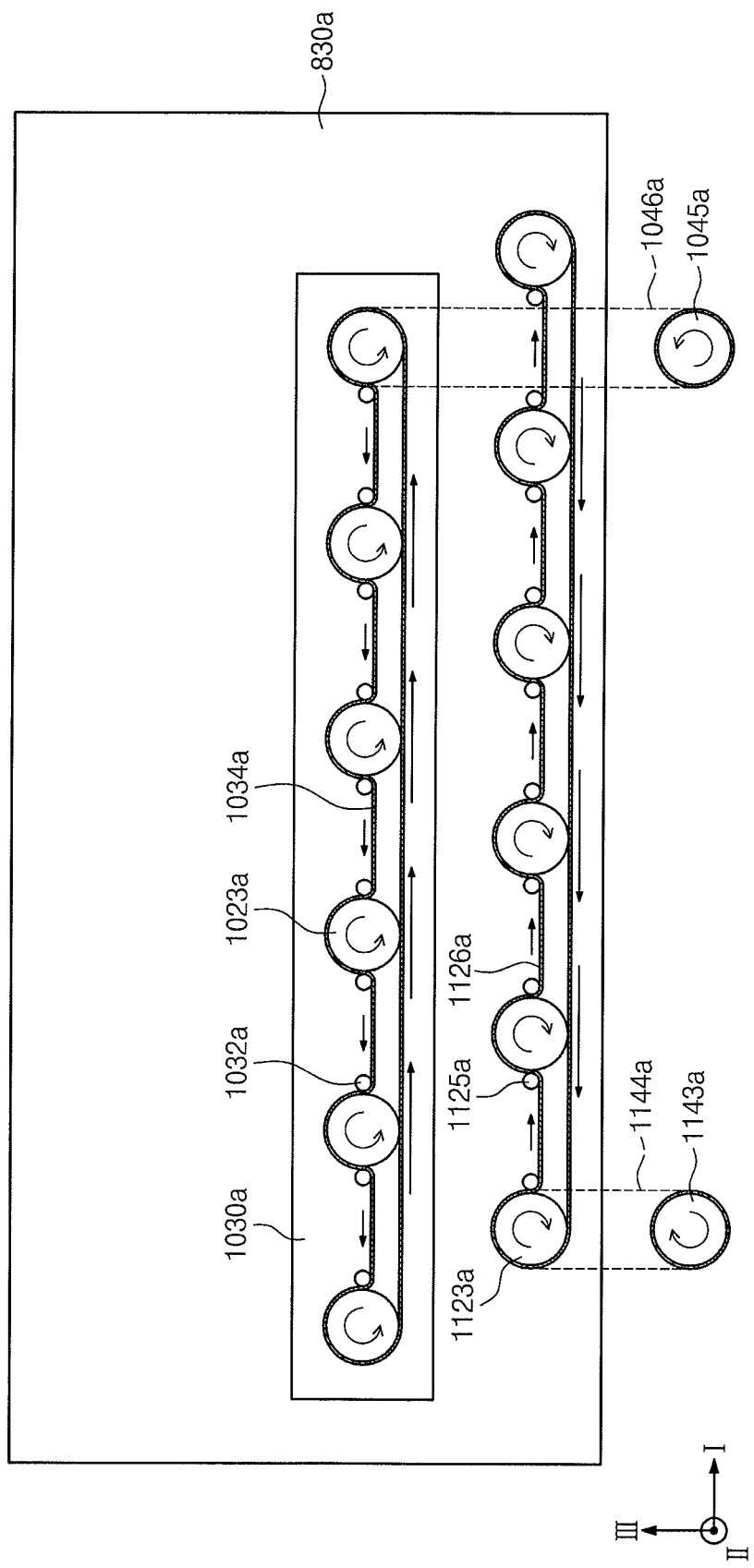
FIG. 7C illustrates a layout of a loading module and an unloading module in FIG. 1.

FIG. 7A is a cross-sectional side, view of the process unit 30 of FIG. 1, and FIG. 7B is a cross-sectional plan view of the process unit 30 of FIG. 1. FIG. 7C illustrates a layout of a loading module and an unloading module in FIG. 1.

Referring to FIGS. 7A through 7C, the process unit 30 includes a processing chamber 800, a support unit 900, a loading module 1000, an unloading module 1100, a showerhead 1200, and an exhaust unit 1300.

The processing chamber 800 has the shape of a cuboid having an empty space therein. The processing chamber 800 includes an upper wall 810, a lower wall 820, and sidewalls 830a, 830b, 830c and 830d. The upper wall 810 and the lower wall 820 are vertically separated and have the rectangular shape. The sidewalls 830a, 830b, 830c and 830d extend from edges of the upper wall 810 to edges of the lower wall 820. The first sidewall 830a and the second sidewall 830b are horizontally separated in the second direction (II). The third sidewall 830c and the fourth sidewall 830d are horizontally separated in the first direction (I).

The support unit 900 is provided inside the processing chamber 800. The support unit 900 supports a tray (T) containing substrates (S). The showerhead 1200 is installed on the upper wall 810 of the processing chamber 800. The showerhead 1200 is provided to face the support unit 900. The showerhead 1200 sprays a process gas onto a substrate. The loading module 1000 and the unloading module 1100 are installed on the first and second sidewalls 830a and 830b of the processing chamber 800. The loading module 1000 loads a tray containing substrates into the processing chamber 800. The unloading module 1100 unloads a tray containing substrates from the processing chamber 800. The exhaust unit 1300 is disposed on the lower wall 820 of the processing chamber 800. The exhaust unit 1300 discharges unreacted gas and by-products remaining in the processing chamber to the outside.

The support unit 900 includes a support plate 810, a driving shaft 920, and a driving member 930. The support plate 910 supports a tray (T) containing substrates (S). The driving shaft 920 is coupled to the undersurface of the support plate 910. The driving member 930 allows the driving shaft 920 to move up and down in the third direction (III). As the driving shaft 920 moves upward by the driving member 930, the tray (T) loaded on the loading module 1000 is supported by the support plate 910 and moves to a processing position in an upper region of the loading module 1000. Then, as the driving shaft 920 moves downward, the tray (T) containing substrates (S) which have undergone thin-film deposition process moves to an unloading position of the unloading module 1100 from the processing position. At this time, the loading module 100 moves to a position where the loading module 1000 does not interfere with the tray (T).

A heater (not shown) for heating a substrate at a processing temperature is provided on the support plate 910. A high-frequency power supply 1400 is connected to the showerhead 1200 so as to apply a high-frequency current. A process gas sprayed by the showerhead 1200 is excited into plasma. This plasma enables a thin film to be deposited onto a substrate (S).

The loading module 1000 loads a tray (T) containing substrates (S) transported from the first treating room 20a of the loadlock unit 20. The loading module 1000 includes first transfer members 1020a and 1020b, and a first driving member 1040. The first transfer members 1020a and 1020b are provided in the first direction (I) on both of the sidewalls 830a and 830b of the processing chamber 800. The first transfer members 1020a and 1020b support both edges of the undersurface of the tray (T), and transfer the tray (T) in the first direction (I). The first driving member 1040 supplies a driving force to the first transfer members 1020a and 1020b.

The first transfer member 1020a is provided in plural on one sidewall 830a of the processing chamber 800 along the first direction (I). The first transfer member 1020b is provided in plural on another sidewall 830b of the processing chamber 800 along the first direction (I) so as to face the first transfer member 1020a. The first transfer members 1020a and 1020b are positioned at a first height corresponding to the height of the first transfer module 21 provided in the first treating room 20a of the loadlock unit 20.

Referring to FIG. 7B, each of the first transfer members 1020a is provided with a feeding roller 1021a, a driving shaft 1022a, a driven pulley 1023s, and a sealing mechanism 1024a. The feeding roller 1021 a is positioned inside the processing chamber 800, and a rotation axis thereof is directed toward the second direction (II). The driven pulley 1023a is positioned outside the processing chamber 800, and a rotation axis thereof is aligned with the rotation axis of the feeding roller 1021a. The driving shaft 1022a is aligned with the rotation centers of the feeding roller 1021a and the driven pulley 1023a, and passes through the sidewall 830a of the processing chamber 800. One end of the driving shaft 1022a is coupled to the feeding roller 1021 a, and the other end of the driving shaft is coupled to the driven pulley 1023a. The sealing mechanism 1024a has the shape of a flange, and is tightly coupled to an outer surface of the sidewall 830a of the processing chamber 800. A magnetic substance is provided on the inner side of the sealing mechanism 1024a, a magnetic fluid is provided between the magnetic substance and the outer side of the driving shaft 1022a. A magnetic force generated by the magnetic substance allows the magnetic fluid to be magnetically induced, thereby sealing a gap between the magnetic substance and the driving shaft 1022a. The driving shaft 1022a is sealed by the magnetic fluid existing inside the sealing mechanism 1024a, and thus the driving shaft 1022a is not only rotatable but also linearly movable in the axial direction.

A movable plate 1030a is disposed between the sealing mechanism 1024a and the driven pulley 1023a. The driving shaft 1022a is rotatably supported by a bearing 1025a provided on the movable plate 1030a. The movable plate 1030a moves linearly in the second direction (II) by a cylinder mechanism 1036a. At this time, the feeding roller 1021a, the driving shaft 1022a, and the driven pulley 1023a move linearly in the second direction (II) together with the movable plate 1030a. Accordingly, when a tray (T) is transferred to the unloading module 1100 from the processing position, the first transfer member 1020a of the loading module 1000 can move back to a position where the first transfer member 1020a does not interfere with the tray (T).

A guide pin 1032a is provided between neighboring driven pulleys 1023a. The guide pin 1032a is positioned in such a way that the rotation axis thereof is aligned with the second direction (II). One end of the guide pin 1032a is coupled to the movable plate 1030a. A belt 1034a is wrapped around the driven pulley 1023a and the guide pin 1032a so as to transfer the rotational force from one of the driven pulleys to the other. A transfer pulley 1026a, which is connected to a drive pulley 1045a of the first driving member 1040 through a belt to receive a rotational driving force, is coupled to the driving shaft 1022a of the first transfer member 1020a disposed at the foremost position among the plural first transfer members 1020a.

The respective first transfer members 1020b are installed on the sidewall 830b of the processing chamber 800 so as to face the respective first transfer members 1020a. The first transfer member 1020b has the same structure as the first transfer member 1020a. Herein, undescribed reference numerals, i.e., 1021b, 1022b, 1023b, 1024b, 1025b, 1026b, 1030b, 1032b, 1034b and 1036b denote a feeding roller, a driving shaft, a driven pulley, a sealing mechanism, a bearing, a transfer pulley, a movable plate, a guide pin, a belt, and a cylinder mechanism, respectively.

Figure 8:
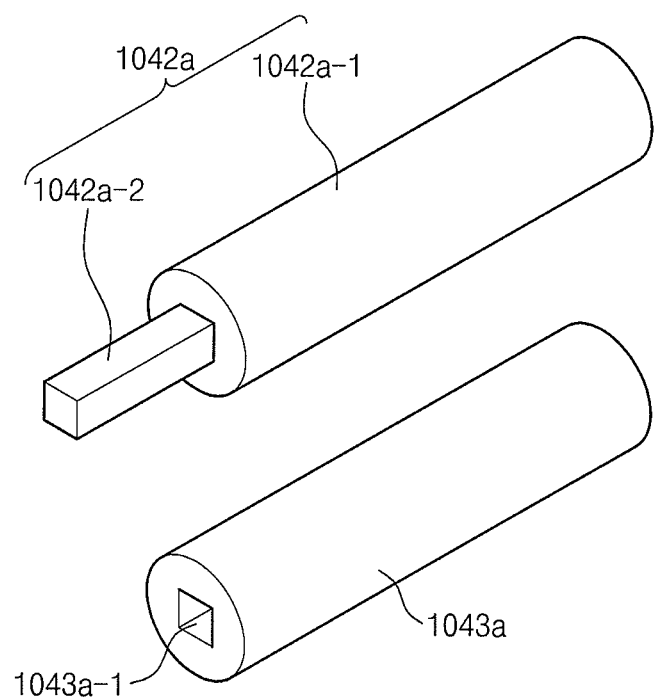
FIG. 8 is a perspective view illustrating a driving shaft of FIG. 7A.

The first driving member 1040 supplies a rotational driving force to the first transfer members 1020a and 1020b for carrying a tray (T) containing substrates (S). The first driving member 1040 includes a first driving motor 1041 disposed below the center of a front area of the lower wall 820 of the processing chamber 800. Driving shafts 1042a and 1042b are respectively coupled to both sides of the first driving motor 1041 in the second direction (II). As illustrated in FIG. 8, the driving shaft 1042a is provided with a first shaft 1042a-1 and a second shaft 1042a-2. The first shaft 1042a-1 has the circular shape. The second shaft 1042a-2 has the shape of a polygonal section longitudinally extending from the center of one end of the first shaft 1042a-1. The second shaft 1042a-2 is inserted into a polygon-shaped hole 1043a-1 of a connection shaft 1043a aligned with the driving shaft 1042a. A power transmission shaft 1044a aligned in a lengthwise direction of the connection shaft 1043a is coupled to the other end of the connection shaft 1043a. A drive pulley 1045a is coupled to the other end of the power transmission shaft 1044a. The drive pulley 1045a is coupled to the transfer pulley 1026a by a belt 1046a.

Figure 9:
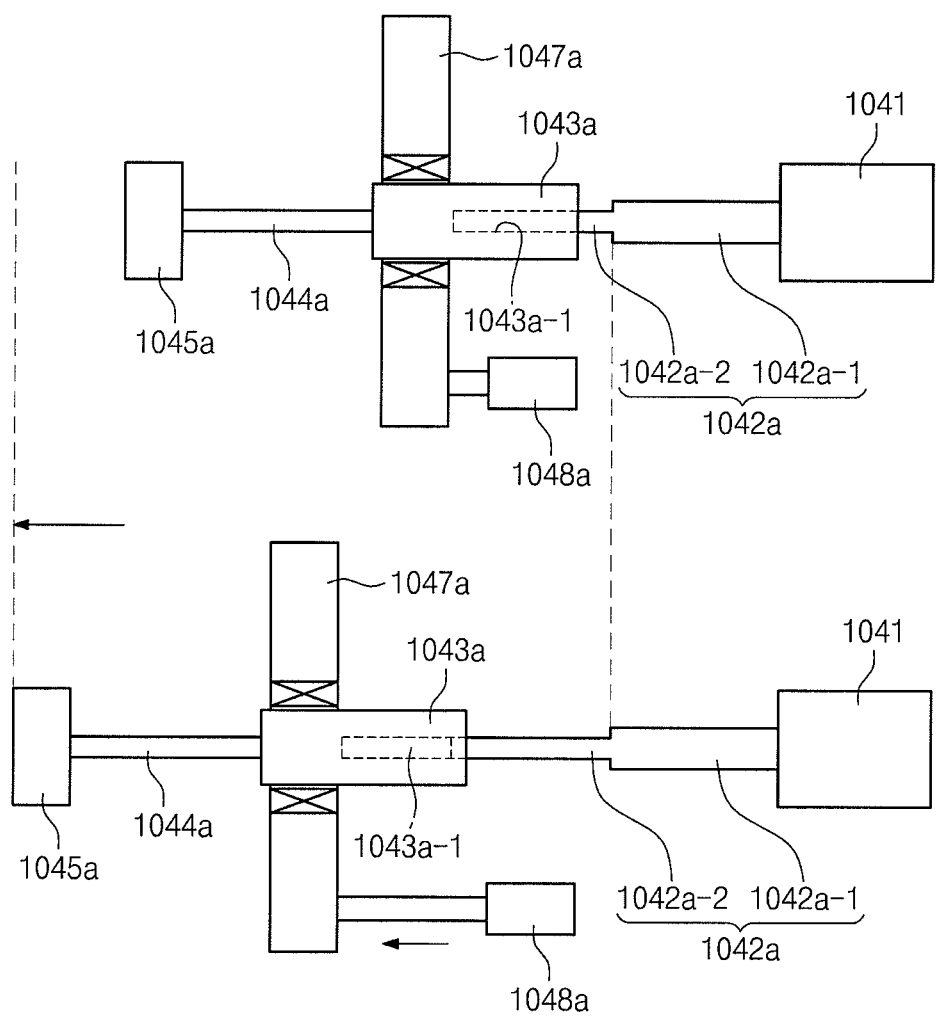
FIG. 9 illustrates an operating procedure of a first driving member of FIG. 7A.

The connection shaft 1043a is rotatably supported by a bearing provided on a support plate 1047a. The support plate 1047a may move linearly in the second direction (II) by a cylinder mechanism 1048a. As illustrated in FIG. 9, when the support plate 1047a moves linearly in the second direction (II) by the cylinder mechanism 1048a, the connection shaft 1043a, the power transmission shaft 1044a, and the drive pulley 1045a move linearly in the second direction (II) together with the support plate 1047a. Herein, undescribed reference numerals, i.e., 1043b, 1044b, 1045b, 1046b, 1047b, and 1048b denote a connection shaft, a power transmission shaft, a drive pulley, a belt, a support plate, and a cylinder mechanism, respectively.

The rotational force of the first driving motor 1041 is transferred to the drive pulley 1045a by the shaft members 1042a, 1043a and 1044a, and then transferred to the drive pulley 1045b by the shaft members 1042b 1043b and 1044b. The rotational forces of the drive pulleys 1045a and 1045b are respectively transferred to the transfer pulleys 1026a and 1026b of the first and second transfer members 1020a and 1020b by the belts 1046a and 1046b. The rotational force of the transfer pulley 1026a is transferred to the driven pulley 1023a by the belt 1034a. The feeding roller 1021a is rotated as the driven pulley 1023a is rotated. Then, as the feeding roller 1021a is rotated, a tray (T) supported by the feeding roller 1021a is transferred in the first direction (I) so that the tray (T) containing substrates (S) is loaded into the processing chamber 800.

The tray (T) loaded into the processing chamber 800 moves to a processing position by elevation of the support plate 910. After a thin film is completely deposited on a substrate (S) at the processing position, the tray (T) moves down to an unloading position, i.e., the position of the unloading module 1100. At this time, the feeding rollers 1021a and 1021b should move in the second direction (II) to be far away from the tray (T) in order to prevent the interference with the descending tray (T). When the movable plates 1030a and 1030b move far way from the processing chamber 800 by the cylinder mechanisms 1036a and 1036b in the second direction (II), the driving shafts 1022a and 1022b supported by the bearings 1025a and 1025b of the movable plates 1030a and 1030b move. Accordingly, the feeding rollers 1021a and 1021b coupled to ends of the driving shafts 1022a and 1022b move without interference with the tray (T). Since the transfer pulleys 1026a and 1026b also move by the movement of the driving shafts 1022a and 1022b, the drive pulleys 1045a and 1045b coupled to the transfer pulleys 1026a and 1026b through the belts 1046a and 1046b also move in the second direction (II).

Figure 10:
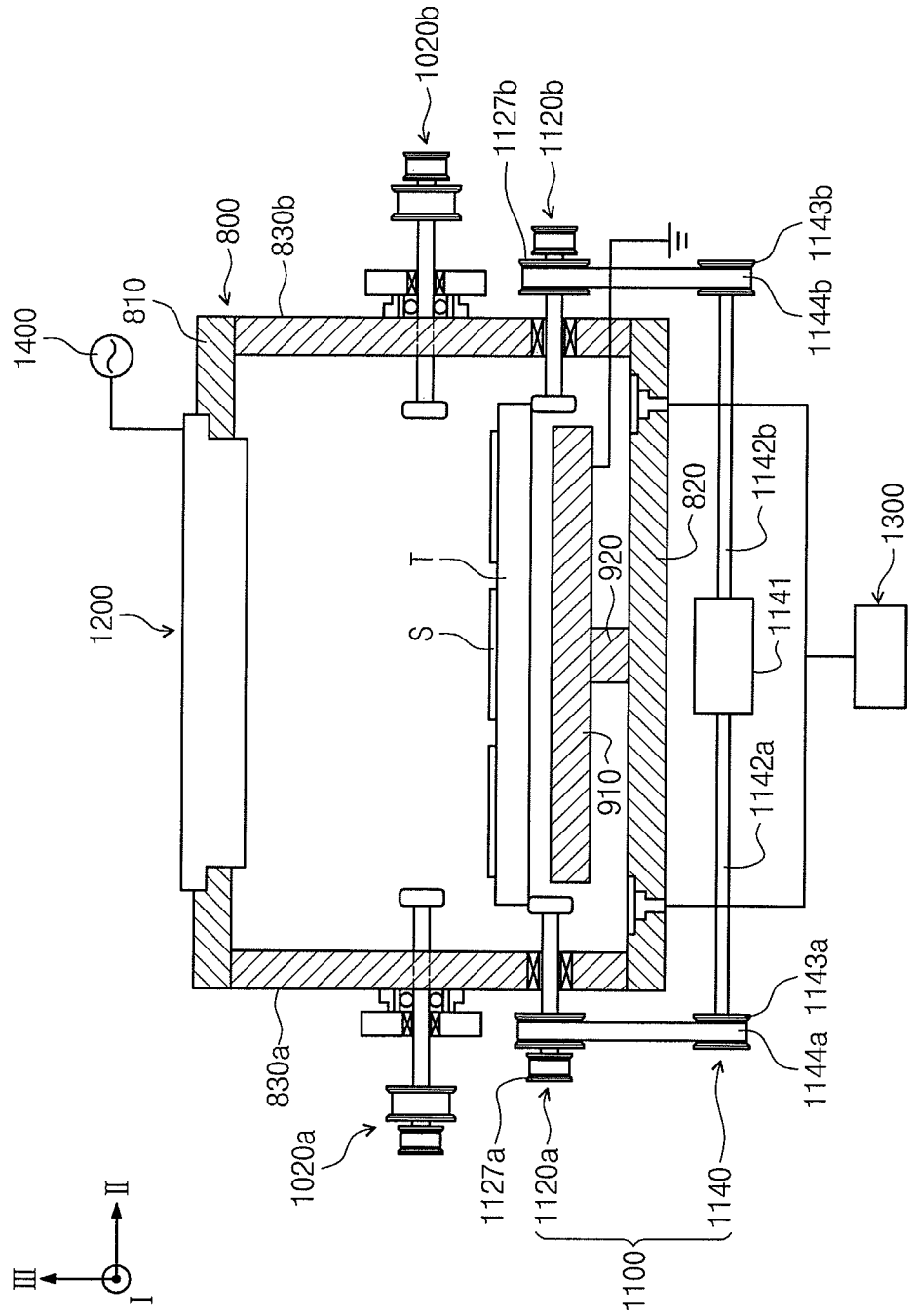
FIG. 10 illustrates the constitution of the unloading unit.
Figure 11:
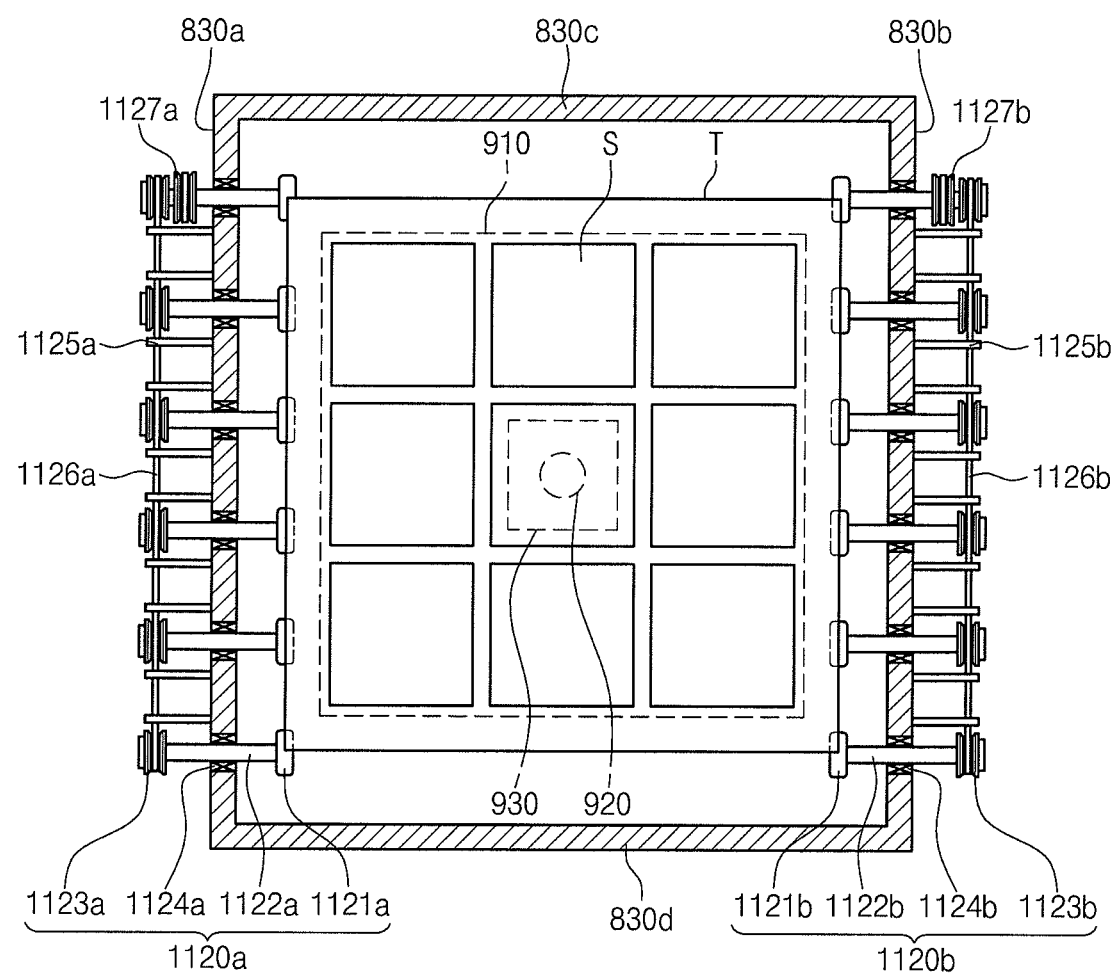
FIG. 11 illustrates transfer members of FIG. 10.

FIG. 10 illustrates the constitution of the unloading unit. FIG. 11 illustrates the transfer members of FIG. 10.

Referring to FIGS. 7C, 10 and 11, the unloading module 1100 includes second transfer members 1120a and 1120b, and a second driving member 1140. The second transfer members 1120a and 1120b are provided on both of the sidewalls 830a and 830b of the processing chamber 800 along the first direction (I). The second transfer members 1120a and 1120b are disposed under the first transfer members 1020a and 1020b of the loading module 1000. The second transfer members 1120a and 1120b support both edges of the undersurface of the tray (T). The second transfer members 1120a and 1120b transfer the tray (T) in the first direction (I). The second transfer members 1120a and 1120b unload the tray (T) containing substrates (S) to the second treating room 20b of the loadlock unit 20 from the processing chamber 800. The second driving member 1140 supplies a driving force to the second transfer members 1120a and 1120b.

The second transfer member 1120a is provided in plural under the first transfer member 1020a of the loading module 1000 along the first direction (I). The second transfer member 1120b is provided in plural on the sidewall 830b of the processing chamber 800 along the first direction (I) so as to face the second transfer member 1120a. The second transfer members 1120a and 1120b are positioned at a second height corresponding to the height of the second transfer module 23 (see FIG. 1) provided in the second treating room 20b of the loadlock unit 20.

Each of the second transfer members 1020a is provided with a feeding roller 1121a, a driving shaft 1122a, and a driven pulley 1123a. The feeding roller 1121a is positioned inside the processing chamber 800, and a rotation axis thereof is directed toward the second direction (II). The driven pulley 1123a is positioned outside the processing chamber 800, and a rotation axis thereof is aligned with the rotation axis of the feeding roller 1121a. The driving shaft 1122a is aligned with the rotation centers of the feeding roller 1121a and the driven pulley 1123a. The driving shaft 1122a is rotatably supported by the bearing 1124a provided on the sidewall 830a of the processing chamber 800. One end of the driving shaft 1122a is coupled to the feeding roller 1121a. The other end of the driving shaft 1122a is coupled to the driven pulley 1123a.

A guide pin 1125a is provided between neighboring driven pulleys 1123a. The guide pin 1125a is positioned in such a way that the rotation axis thereof is aligned with the second direction (II). One end of the guide pin 1125a is coupled to sidewall 830 of the processing chamber 800. A belt 1126a is wrapped around the driven pulley 1123a and the guide pin 1125a so as to transfer the rotational force from one of the driven pulleys 1123a to the other. A transfer pulley 1127a, which is connected to a drive pulley 1143a of the driving member 1140 through a belt to receive a rotational driving force, is coupled to the driving shaft of the second transfer member 1120a disposed at the rearmost position among the plural second transfer members 1120a.

The first transfer members 1020b are installed on the sidewall 830b of the processing chamber 800 so as to face the respective second transfer members 1120a. The second transfer member 1120b has the same structure as the second transfer member 1120a, and thus the description will be omitted herein. Here, undescribed reference numerals, i.e., 1121b, 1122b, 1123b, 1124b, 1125b, 1126b, and 1127b denote a feeding roller, a driving shaft, a driven pulley, a bearing, a guide pin, a belt, and a transfer pulley, respectively.

The second driving member 1140 supplies a rotational driving force to the second transfer members 1120a and 1120b for carrying a tray (T) containing substrates (S). The second driving member 1140 includes a second driving motor 1141 disposed below the center of a front area of the lower wall 820 of the processing chamber 800. Driving shafts 1142a and 1142b are respectively coupled to both sides of the second driving motor 1141 in the second direction (II). Drive pulleys 1143a and 1143b are coupled to ends of the driving shafts 1142a and 1142b, respectively. The drive pulleys 1143a and 1143b are coupled to the transfer pulleys 1127 and 1127b by the belts 1144a and 1144b, respectively.

The rotational force of the second driving motor 1141 is transferred to the drive pulleys 1143a and 1143b by the driving shafts 1142a and 1142b, and the rotational forces of the drive pulleys 1143a and 1143b are respectively transferred to the transfer pulleys 1127a and 1127b of the second transfer members 1120a and 1120b. The rotational forces of the transfer pulleys 1127a and 1127b are transferred to the driven pulleys 1123a and 1123b by the belts 1126a and 1126b, and the feeding rollers 1121a and 1121b are rotated as the driven pulleys 1123a and 1123b are rotated. Then, as the feeding rollers 1021a and 1121b are rotated, a tray (T) supported by the feeding rollers 1021a and 1121b is transferred in the first direction (I) so that the tray (T) containing substrates (S) is unloaded into the second treating room 20b of the loadlock unit 20 from the processing chamber 800.

Figure 12:
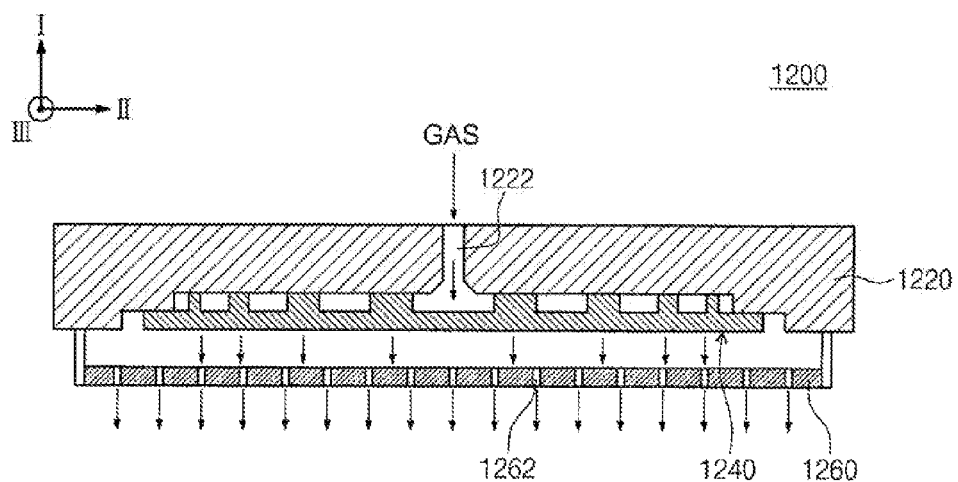
FIG. 12 is a cross-sectional view of a showerhead of FIG. 7A.
Figure 13:
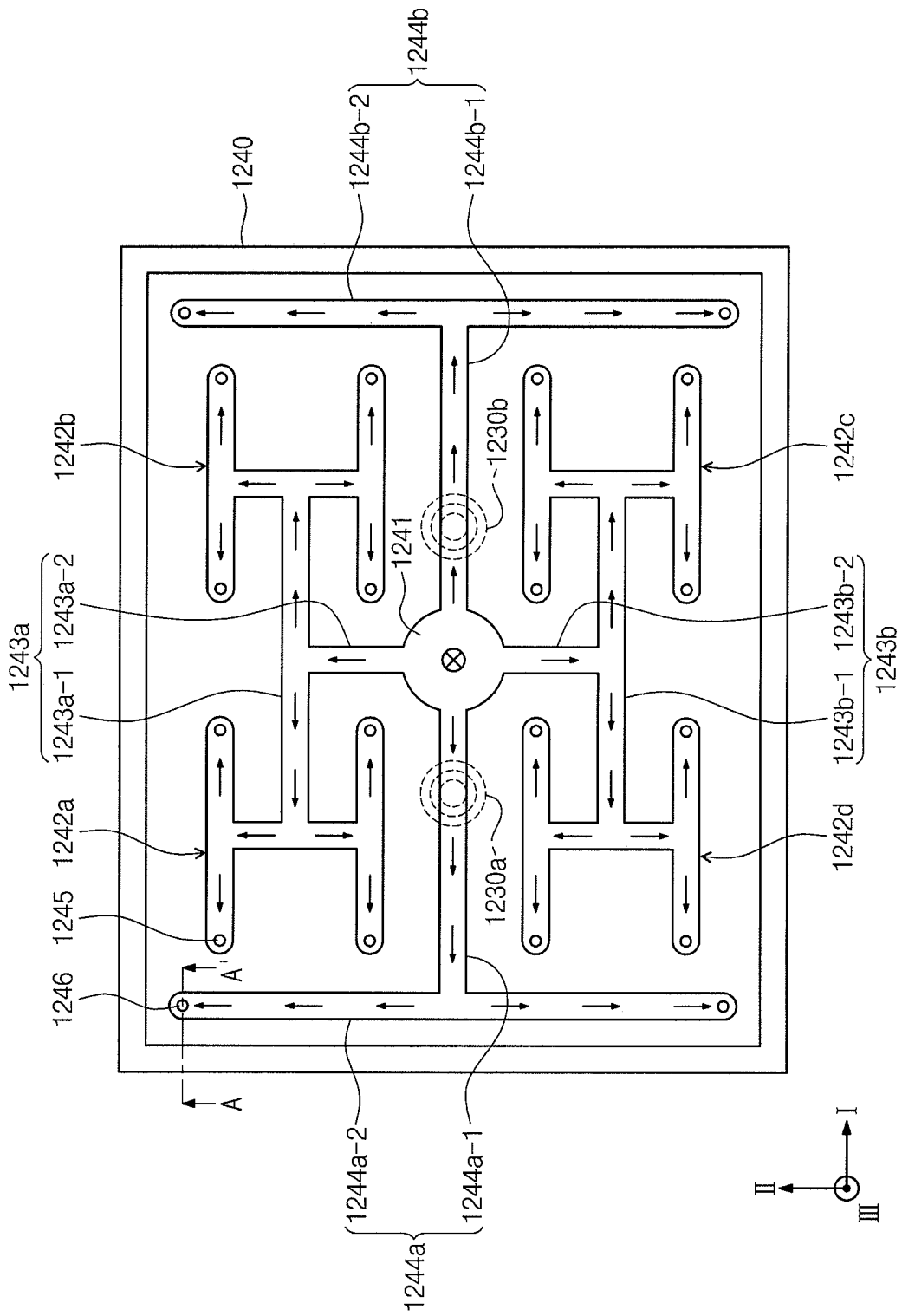
FIG. 13 is a plan view of a baffle plate of FIG. 7A.

FIG. 12 is a cross-sectional view of a showerhead of FIG. 7A. FIG. 13 is a plan view of a baffle plate of FIG. 7A.

Referring to FIGS. 12 and 13, the showerhead 1200 includes an electrode 1220, a baffle plate 1240, and a spray plate 1260.

A gas supplied to the showerhead 1200 may be a gas mixture of a raw gas and a reactive gas. The raw gas contains a main element of a thin film to be formed on a substrate (S), and the reactive gas is used for forming plasma. For instance, if a silicon oxide film is deposited on a substrate, $SiH_4$ is used as the raw gas and $O_2$ is used as the reactive gas. According to another example, if a silicon nitride film is deposited on a substrate, $SiH_4$ is used as the raw gas, and $NH_3$ and $N_2$ are used as the reactive gas. According to yet another example, if an amorphous silicon film is deposited on a substrate, SiH$_4$ is used as the raw gas and the H$_2$ is used as the reactive gas.

The electrode 1220 may have the shape of a rectangular plate in general. A gas inlet hole 1222 through which a gas is introduced is formed at the center of the electrode 1220. A high-frequency power supply (see 1400 of FIG. 2) is connected to the electrode 1220 to apply a high-frequency current for plasma generation. The top surface of the baffle plate 1240 is tightly coupled to the undersurface of the electrode 1220. A plurality of gas channels guiding the flow of a gas supplied through the gas inlet hole 1222 of the electrode 1220 are formed on the top surface of the baffle plate 1240.

A gas supply groove 1241 communicated with the gas inlet hole 1222 of the electrode 1220 is formed at the central portion of the top surface of the baffle plate 1240, and I-shaped first channels 1242*a*, 1242*b*, 1242*c* and 1242*d* are formed to a quadrilateral configuration around the gas supply groove 1241. Holes 1254 are formed at ends of horizontal parts of the I-shaped first channels 1242*a*, 1242*b*, 1242*c* and 1242*d* to allow a gas to pass therethrough. The first channels 1242*a* and 1242*b*, which are disposed above the gas supply groove 1241 based on the second direction (II), are connected to the gas supply groove 1241 by a T-shaped first connection channel 1243*a*. Both ends of the horizontal part 1243*a*-1 of the first connection channel 1243*a* are coupled to the centers of vertical parts of the first channels 1242*a* and 1242*b*, and a lower end of a vertical part 1243*a*-2 of the first connection channel 1243*a* is coupled to the gas supply groove 1241. The first channels 1242*c* and 1242*d*, which are disposed below the gas supply groove 1241 based on the third direction (III) are connected to the gas supply groove 1241 by an inverse T-shaped second connection channel 1243*b*. Both ends of a horizontal part 1243*b*-1 of the second connection channel 1243*b* are coupled to the centers of vertical parts of the first channels 1242*c* and 1242*d*, and an upper end of a vertical part 1243*b*-2 of the second connection channel 1243*b* is coupled to the gas supply groove 1241.

Based on the first direction (I), second channels 1244*a*-2 and 1244*b*-2 are formed long in the second direction (II) at both edges of the baffle plate 1240 which are disposed outside the first channels 1242*a* and 1242*d* and outside the first channels 1242*b* and 1242*c*. Holes 1246 are formed at both ends of the second channels 1244*a*-2 and 1244*b*-2. The second channels 1244*a*-2 and 1244*b*-2 are connected to the gas supply groove 1241 by the second connection channels 1244*a*-1 and 1244*b*-1 extending in the first direction (I). One ends of the second connection channels 1244*a*-1 and 1244*b*-1 are connected to the centers of the second channels 1244*a*-2 and 1244*b*-2, and the other ends of the second connection channels 1244*a*-1 and 1244*b*-1 are connected to the gas supply groove 1241.

The spray plate 1260 is disposed under the baffle plate 1240, and includes a plurality of spray holes 1262. The gas passing through the holes 1245 and 1246 of the baffle plate 1240 is sprayed onto substrates (S) contained in a tray (T) through the plurality of spray holes 1262.

Figure 14A:
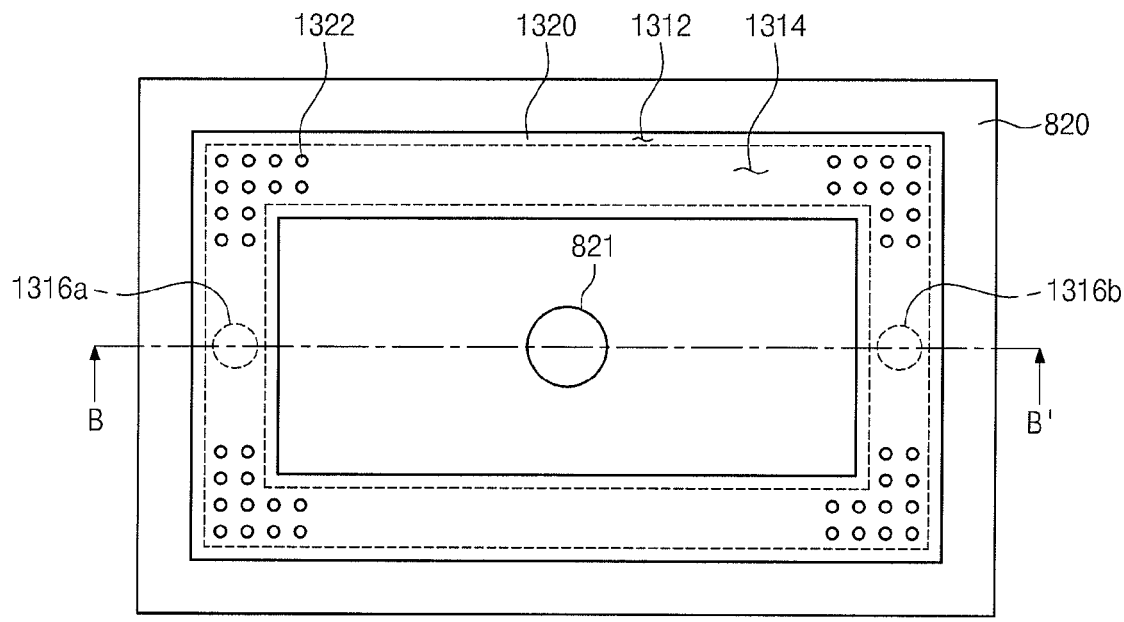
FIG. 14A is a plan view of a lower wall of a processing chamber of FIG. 7A.
Figure 14B:
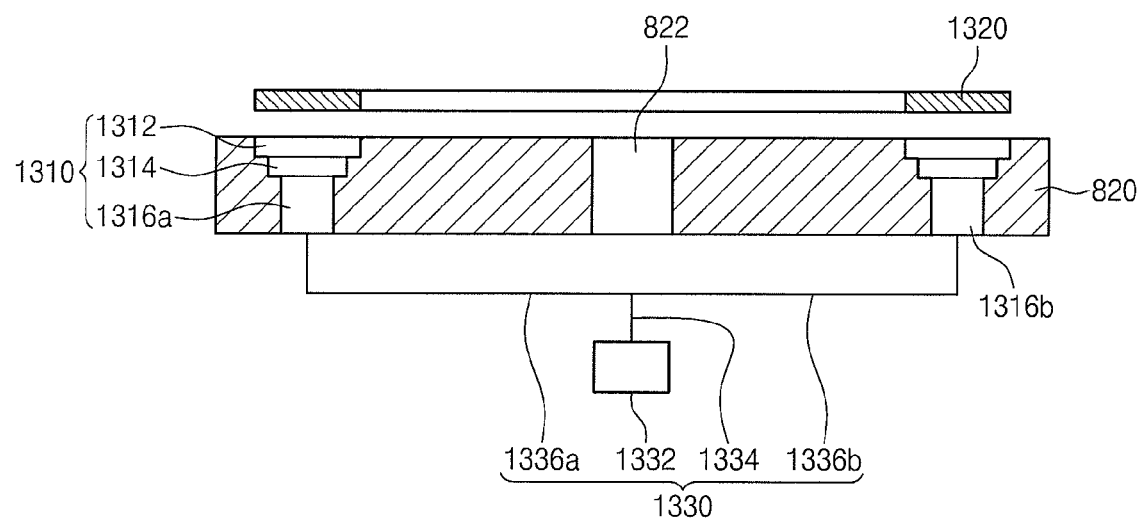
FIG. 14B is a cross-sectional view taken along line B-B' of FIG. 14A.

FIG. 14A is a plan view of the lower wall of a processing chamber of FIG. 7A. FIG. 14B is a cross-sectional view taken along line B-B' of FIG. 14A.

Referring to FIGS. 14A and 14B, the exhaust unit 1300 includes an exhaust hole 1310, an exhaust plate 1320, and an exhaust member 1330. The exhaust hole 1310 includes a first groove 1312, a second groove 1314, and a plurality of holes 1316*a* and 1316*b*. The first groove 1312 is formed along edges of four sides on the top surface of the lower wall 820 of the processing chamber 800. The second groove 1314 is formed at the same position of the first groove 1312 to form a stepwise configuration with the first groove 1312. The plurality of holes 1316*a* and 1316*b* are symmetrically arranged with respect to the hole 821 formed at the center of the lower wall 820, and passes through the lower wall 820 at the second groove 1314 to allow the driving shaft 920 of the support unit 900 to be inserted thereinto. A plurality of holes 1322 are formed in two rows around four corners of the exhaust plate 1320 so as to discharge the exhaust gas. The exhaust member 1330 includes a pump 1332, a main exhaust line 1334, and a plurality of branch lines 1336*a* and 1336*b*. The main exhaust line 1334 is coupled to the pump 1332. The branch lines 1336*a* and 1336*b* are branched from the exhaust line 1334. The branch lines 1336*a* and 1336*b* are branched to be symmetrically arranged with respect to the main exhaust line 1334. Ends of the branch lines 1336*a* and 1336*b* are coupled to the plurality of holes 1316*a* and 1316*b* which are symmetrically formed in the lower wall 820 of the processing chamber 800.

Figure 15:
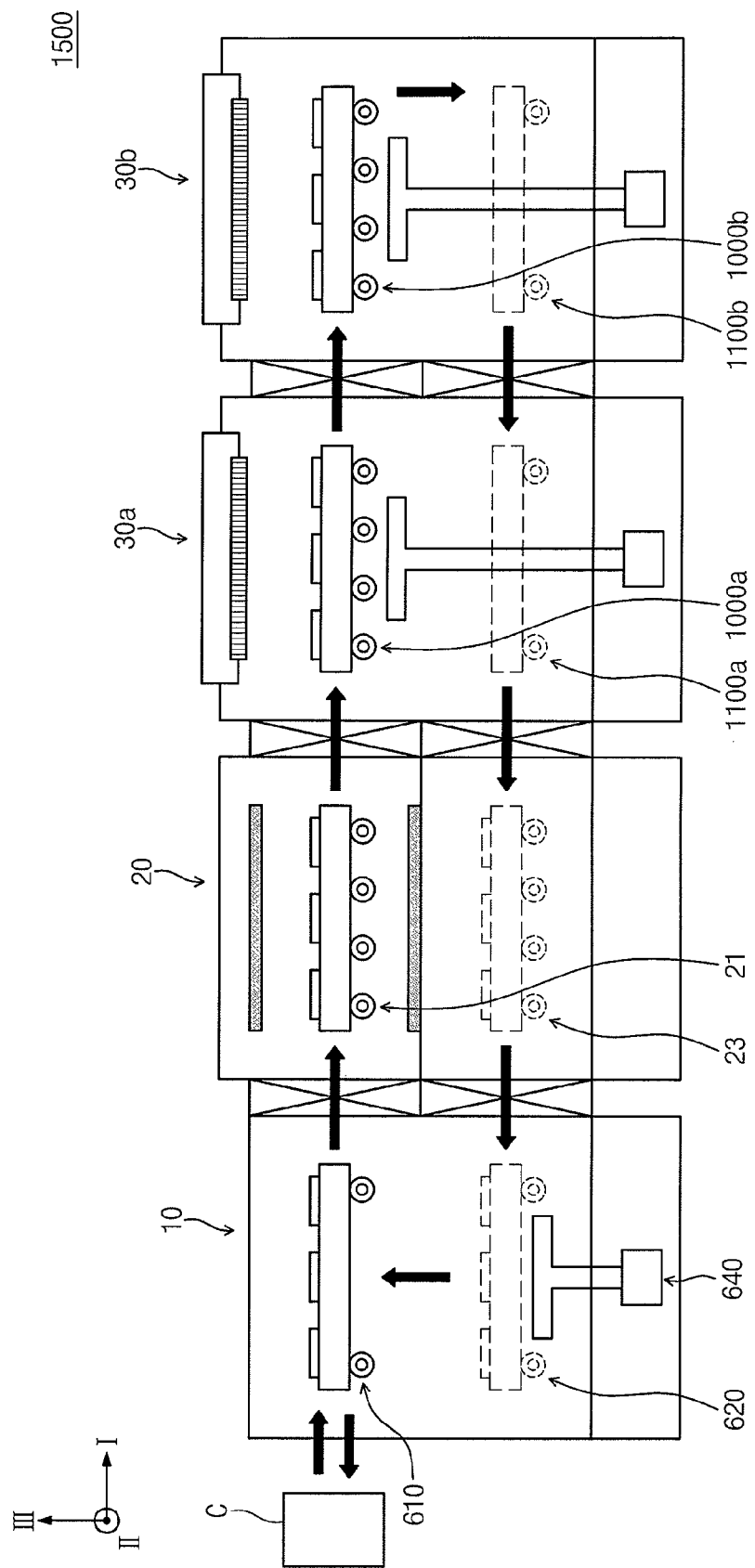
FIG. 15 illustrates a layout of a substrate treating apparatus according to another embodiment of the present invention.

FIG. 15 illustrates a layout of a substrate treating apparatus according to another embodiment of the present invention.

Referring to FIG. 15, the substrate treating apparatus 1500 includes a loading/unloading unit 10, a loadlock unit 20, a first process unit 30*a*, and a second process unit 30*b*.

In the substrate treating apparatus of FIG. 15, the loading/unloading unit 10 and the loadlock unit 20 have the same structure as the loading/unloading unit 10 and the loadlock unit 20 in FIG. 1. Also, each of the first process unit 30*a* and the second process unit 30*b* in FIG. 15 has the same structure as the process unit 30 in FIG. 1. In Claims, a first transfer module 21, a first loading module 1000*a*, and a second loading module 1000 may be collectively described as a first transfer unit, and a second transfer module 23, a first unloading module 1100*a*, and a second unloading module 1100*b* may be collectively described as a second transfer unit. Also, the first transfer unit and the second transfer unit may be described as a carrying member. In the substrate treating apparatus 1500 of FIG. 15, a tray (T) containing substrates (S) is transferred in a sequence of a carrying section 610, the first transfer module 21, the first loading module 1000*a*, the second loading module 1000*b*, and a carrying section 620. Meanwhile, processes performed in the first process unit 30*a* and the second process unit 30*b* may be different from each other. As an example, a deposition process may be performed in the first process unit 30*a*, whereas another deposition process may be performed in the second process unit 30*b*. More specifically, in a deposition of an anti-reflection layer on a solar cell substrate, a silicon nitride layer deposition process may be performed in the first process unit 30*a*, and a silicon oxide layer deposition process may be performed in the second process unit 30*b*. Also, in a deposition of a thin layer for a hetero junction solar cell, an intrinsic-Si deposition process may be performed in the first process unit 30*a*, and a P-type or N-type Si deposition process may be performed in the second process unit 30*b*. Alternatively, the same type of deposition process may be performed in the first process unit 30*a* and the second process unit 30*b*. At this time, of the trays (T) containing substrates (S), a preceding tray (T) is transferred to the second process unit 30*b* via the first process unit 30*a*, and a following tray (T) is transferred to the first process unit 30*a*. When processes are completed in the first process unit 30*a* and the second process unit 30*b*, the tray (T) in the first process unit 30*a* is transferred to the loadlock unit 20 through the first unloading module 1100*a*. And, the tray (T) in the second process unit 30*b* is transferred to the first unloading module 1100*a* through the second unloading module 1100*b*, and then is transferred to the loadlock unit 20 through the first unloading module 1100*a*.

Figure 16B:
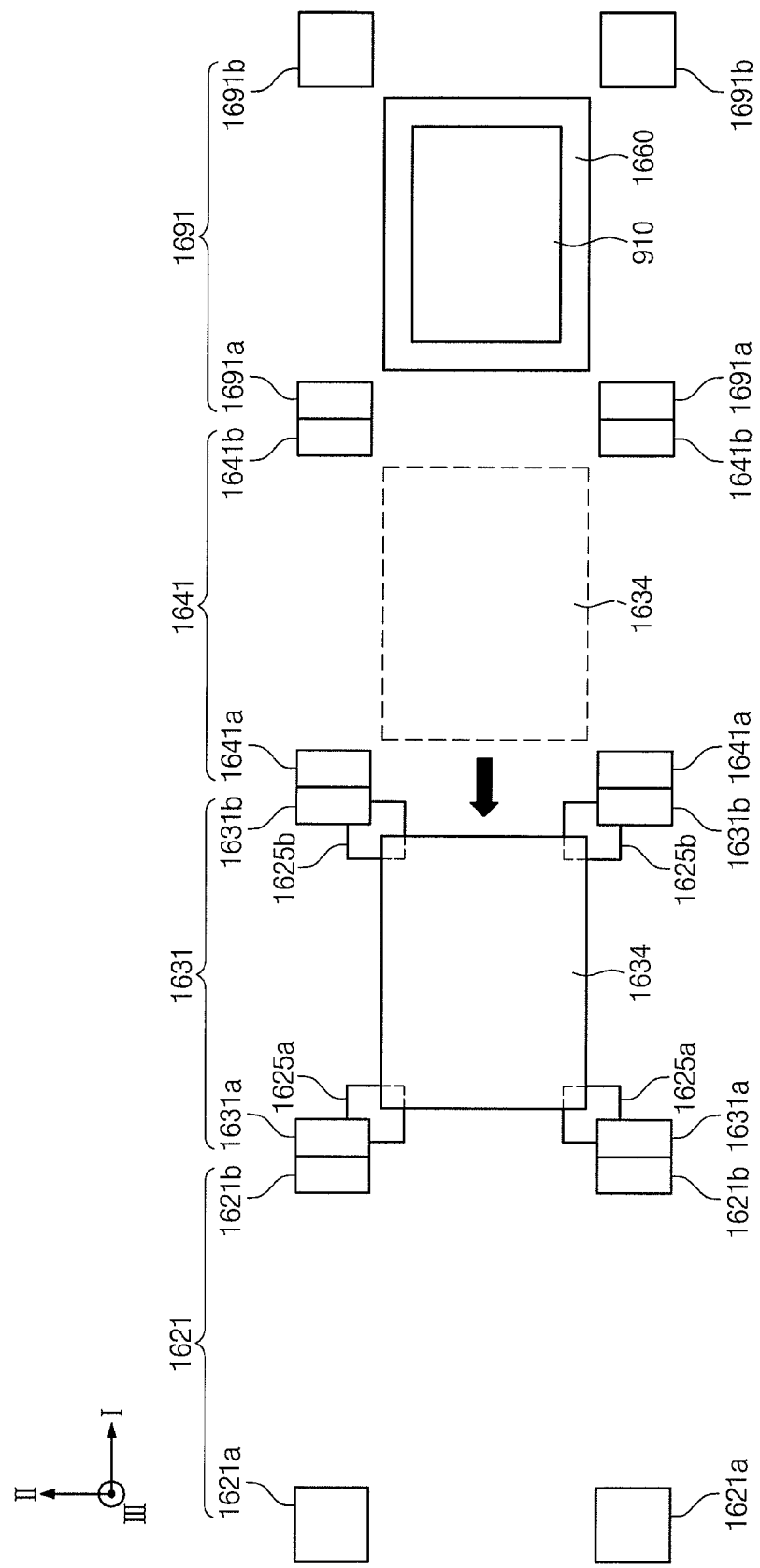
FIG. 16B is a plan view illustrating a layout of the substrate treating apparatus of FIG. 16A.
Figure 16C:
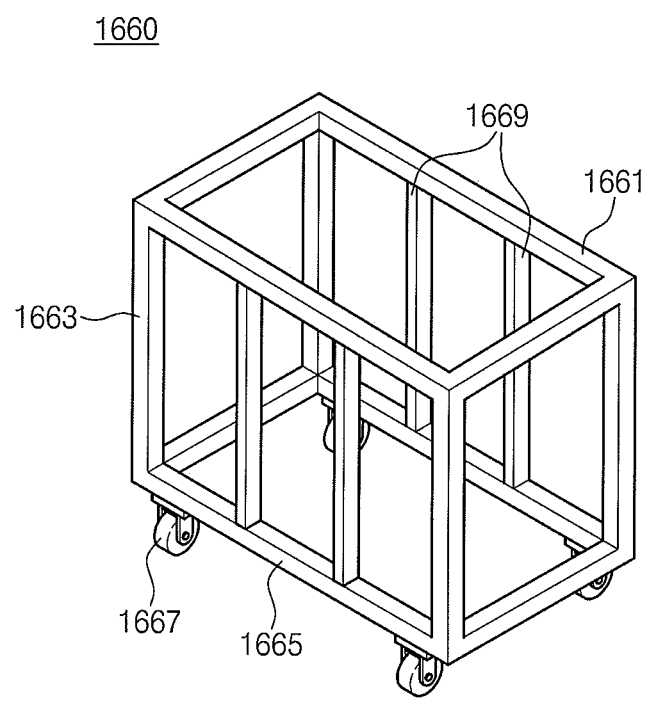
FIG. 16C is a perspective view illustrating a holding unit of FIG. 16A.
Figure 17B:
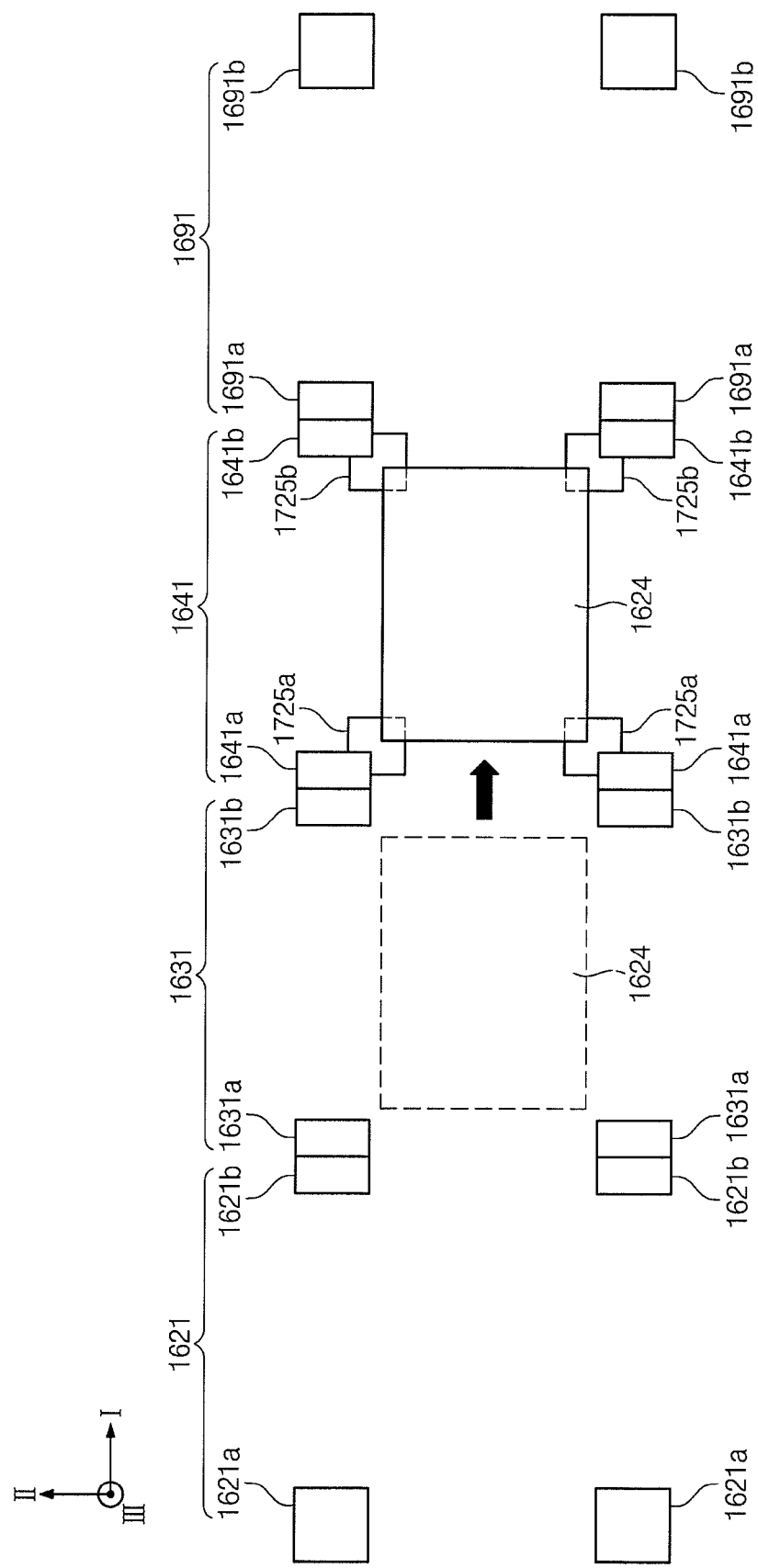
FIG. 17B is a plan view illustrating a layout of the substrate treating apparatus of FIG. 17A.

FIG. 16A illustrates a layout according to another example of the substrate treating apparatus of FIG. 15, and FIG. 16B is a plan view illustrating a layout of the substrate treating apparatus of FIG. 16A. FIG. 16C is a perspective view illustrating a holding unit of FIG. 16A. FIG. 17A illustrates a layout according to another example of the substrate treating apparatus of FIG. 16A. FIG. 17B is a plan view illustrating a layout of the substrate treating apparatus of FIG. 17A.

Referring to the accompanying drawings, each of the substrate treating apparatuses 1600 and 1700 includes a loading/unloading unit 10, a loadlock unit 20, a process unit 30, a crane unit 1610, a frame section 1650, and a holding unit 1660. The loading/unloading unit 10, the loadlock unit 20 and the process unit 30 in the substrate treating apparatus 1600 have the same structure as the loading/unloading unit 10, the loadlock unit 20 and the process unit 30 in the substrate treating apparatus illustrated in FIG. 15. However, it is noted that a loadlock unit lead 1624 and a process unit lead 1634 respectively provided at upper portions of the loadlock unit 20 and the process unit 30 are expressed more specifically.

Hereinafter, the crane unit 1610, the frame section 1650, and the holding unit 1660 will be described with reference to the accompanying drawings.

The crane unit 1610 is provided at upper portions of the loading/unloading unit 10, the loadlock unit 20 and the process unit 30. The crane unit 1610 is provided to efficiently perform maintenance on the loading/unloading unit 10, the loadlock unit 20 and the process unit 30. The frame section 1650 supports the crane unit 1610. The frame section 1650 includes a first frame section 1620, a second frame section 1630, a third frame section 1640, and a fourth frame section 1690. The first frame section 1620 is disposed above the loading/unloading unit 10. The second frame section 1630 is disposed above the loadlock unit 20. The third frame section 1640 is disposed above the process unit 30. The fourth frame section 1690 is disposed adjacent to the third frame section 1640 in a first direction (I). The first frame section 1620 includes a first side frame section 1621 and a first upper frame section 1623. The second frame section 1630 includes a second side frame section 1631 and a second upper frame section 1633. The third frame section 1640 includes a third side frame section 1641 and a third upper frame section 1643. The fourth frame section 1690 includes a fourth side frame section 1691 and a fourth upper frame section 1693.

Referring to FIG. 16B, the first side frame section 1621 is provided in four sections 1621a, 1621b. A space between the first side frame sections 1621a disposed in parallel in a second direction (II) is greater than a length of the process unit lead 1634 in the second direction (II). A space between the first side frame sections 1621a and 1621b disposed in parallel in the first direction (I) is greater than a length of the process unit lead 1634 in the first direction (I). The second side frame section 1631 is provided in four sections 1631a and 1631b. A space between the second side frame sections 1631 may be provided to be the same as the space between the first side frame sections 1621. The third side frame section 1641 is provided in four sections 1641a and 1641b. A space between the third side frame sections 1641 may be provided to be the same as the space between the first side frame sections 1621. The fourth side frame section 1691 is provided in four sections 1691a and 1691b. A space between the fourth side frame sections 1691 may be provided to be the same as the space between the first side frame sections 1621.

The first side frame section 1621b and the second side frame section 1631a, which are disposed adjacent to each other, may be integrally formed into one section. Also, the second side frame section 1631 b and the third side frame section 1641a, which are disposed adjacent to each other, may be integrally formed into one section. Further, the third side frame section 1641b and the fourth side frame section 1691a, which are disposed adjacent to each other, may be integrally formed into one section.

The first upper frame section 1623, the second upper frame section 1633, the third upper frame section 1643 and the fourth upper frame section 1693 are connected in the first direction (I). The crane unit 1610 moves in the first direction (I) along the first upper frame section 1623, the second upper frame section 1633, the third upper frame section 1643 and the fourth upper frame section 1693.

Referring to FIGS. 16A and 16B, a holding section 1625 may be provided on the second side frame section 1631. As illustrated in FIG. 16A, the holding section 1625 supports the process unit lead 1634. Alternatively, the holding section 1625 may support the loadlock unit lead 1624. The holding section 1625 is provided to be further protruded inwardly from the second side frame section 1631. As an example, the holding section 1625 may have the shape of a rectangular plate. Alternatively, the holding section 1625 may have the shape of a circular plate. A space between the holding sections 1625 arranged in parallel in the second direction (II) is less than a length of the process unit lead 1634 in the second direction (II). A space between the holding sections 1625 arranged in parallel in the first direction (I) is less than a length of the process unit lead 1634 in the first direction (I). Four vertexes of the process unit lead 1634 are supported by the holding sections 1625a, 1625b.

Referring to FIGS. 16A through 16D, the holding unit 1660, 1680 is disposed in the fourth frame section 1690. The holding unit 1660, 1680 includes a body section, a hole, and moving means.

As an example, referring to FIG. 16C, the body section of the holding unit 1660 includes an upper frame 1661, a side frame 1663, and a lower frame 1665. When viewed from the top, the upper frame 1661 is provided in a rectangular plate having a hollow formed therein. In FIG. 16C, there is illustrated an example having a rectangular hollow formed in the upper frame 1661. The side frame 1663 extends vertically to a lower side from an edge of the upper frame 1661. As an example, the side frame 1663 may be provided in a bar shape which extends vertically to a lower side from each of vertexes of the upper frame 1661. Also, an auxiliary frame 1669 may be further provided between the side frames 1663 which are spaced from each other in the first direction (I). For example, the auxiliary frame 1669 may also have the shape of a bar. The lower frame 1665 is provided at a lower end of the side frame 1663 in parallel to the upper frame 1661. Like the upper frame 1661, the lower frame 1665 is provided in a rectangular plate having a hollow formed therein. Thus, the holding unit 1660 comprised of the respective frames 1661, 1663 and 1665 may be provided in a cuboid shape of which side faces, lower face and upper face are opened. Meanwhile, in Claims, an imaginary line connecting the hollows respectively provided in the upper frame 1661 and the lower frame 1665 may be expressed as a hole. Moving means 1667 may be provided to lower edges of the lower frame 1665. As an example, the moving means 1667 may be wheels.

Figure 16D:
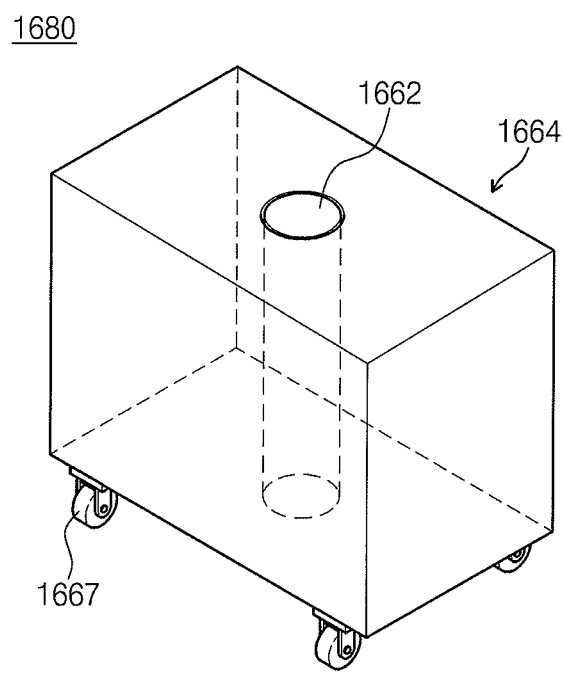
FIG. 16D is a perspective view illustrating another example of the holding unit of FIG. 16A.

As another example, referring to FIG. 16D, the body section 1664 of the holding unit 1680 may be provided in a cuboid box-shape. The hole 1662 may be provided to penetrate the body section 1664 from an upper side to a lower side of the body section 1664. The moving means 1667 is provided in the same manner as the moving means 1667 in FIG. 16C.

A supporting unit 900 separated from the process unit 30 is placed on the holding unit 1660, 1680 having the foregoing structure. At this time, a driving shaft 920 of the supporting unit 900 is inserted into the foregoing hole. The undersurface of a supporting plate 910 of the supporting unit 900 is in contact with an upper face of the body section of the holding unit 1660, 1680. Alternatively, the loadlock unit lead 1624 or the process unit lead 1634 may be placed on the holding unit 1660, 1680.

A maintenance operation of the substrate treating apparatus using the crane unit and the holding unit will be described with reference to FIGS. 16A and 16B.

An operator positions the crane unit 1610 to the second upper frame section 1633. The operator connects the crane unit 1610 with connecting members 1634*a* and 1634*b* coupled to upper portions of the process unit lead 1634 through a chain 1611. The connecting members 1634*a* and 1634*b* may be provided in an eye bolt. The operator separates the process unit lead 1634 from the process unit 30 and then moves the separated process unit lead 1634 to the holding section 1625 of the second frame section 1630. After placing the process unit lead 1634 on the holding section 1625, the operator moves the crane unit 1610 to the third upper frame section 1643. The operator connects the crane unit 1610 with connecting members 1634*a* and 1634*b* coupled to upper portions of the process unit lead 1634 through a chain 1611. The connecting members 1634*a* and 1634*b* may be provided in an eye bolt. After separating the supporting plate 910 from the process unit 30, the operator places the separated supporting plate 910 on the holding unit 1660. The operator inspects an inside of the process unit 30 and the supporting plate 910.

Alternatively, in the case where the operator tries to inspect an inside of the loadlock unit 20, the operator positions the crane unit 1610 to the second upper frame section 1633. The operator connects the crane unit 1610 with the connecting members 1624*a* and 1624*b* coupled to upper portions of the loadlock unit lead 1624 through the chain 1611. After separating the loadlock unit lead 1624 from the loadlock unit 20, the operator moves the separated loadlock unit lead 1624 towards a direction of the third frame section 1640. At this time, the loadlock unit lead 1624 moves between an undersurface of the holding section 1625 and an upper surface of the loadlock unit 20. After elevating the loadlock unit lead 1624 which moved to a lower side of the third frame section 1640, the operator again moves the loadlock unit lead 1624 towards the direction of the loadlock unit 20 and places the loadlock unit lead 1624 on the holding section 1625. Thereafter, the operator inspects the inside of the loadlock unit 20 and the loadlock unit lead 1624.

Alternatively, after placing the loadlock unit lead 1624 or the process unit lead 1634 not on the holding section 1625 but on the holding unit 1660, the operator may inspect the substrate treating apparatus 1600.

Meanwhile, as illustrated in FIGS. 17A and 17B, a holding section 1725 may be provided to the third side frame section 1641. In this case, a process which an operation inspects units constituting a substrate treating apparatus 1700 will be described below.

The operator positions the crane unit 1610 to the second upper frame section 1633. The operator connects the connecting members 1624*a* and 1624*b* to upper portions of the loadlock unit lead 1624. The connecting members 1624*a* and 1624*b* may be provided in an eye bolt. The operator connects the connecting members 1642*a* and 1642*b* with the crane unit 1610 through the chain 1611. After separating the loadlock unit lead 1624 from the loadlock unit 20, the operator moves the separated loadlock unit lead 1624 to the holding section 1725 of the third frame section 1640. The operator places the loadlock unit lead 1624 on the holding section 1725 and then inspects the inside of the loadlock unit 20.

Alternatively, in case where the operator tries to inspect an inside of the process unit 30, the operator positions the crane unit 1610 to the third upper frame section 1643. The operator connects the crane unit 1610 with the connecting members 1634*a* and 1634*b* coupled to upper portions of the process unit lead 1634 through the chain 1611. After separating the process unit lead 1634 from the process unit 30, the operator moves the separated process unit lead 1634 towards a direction of the second frame section 1630. At this time, the process unit lead 1634 moves between an undersurface of the holding section 1725 and an upper surface of the process unit 30. After elevating the process unit lead 1634 which moved to a lower side of the second frame section 1630, the operator again moves the process unit lead 1634 towards the direction of the process unit 30 and places the process unit lead 1634 on the holding section 1725. Thereafter, the operator inspects the inside of the process unit 30 and the process unit lead 1634.

Alternatively, after placing the loadlock unit lead 1624 or the process unit lead 1634 not on the holding section 1725 but on the holding unit 1660, the operator may inspect the substrate treating apparatus 1700.

Figure 18A:
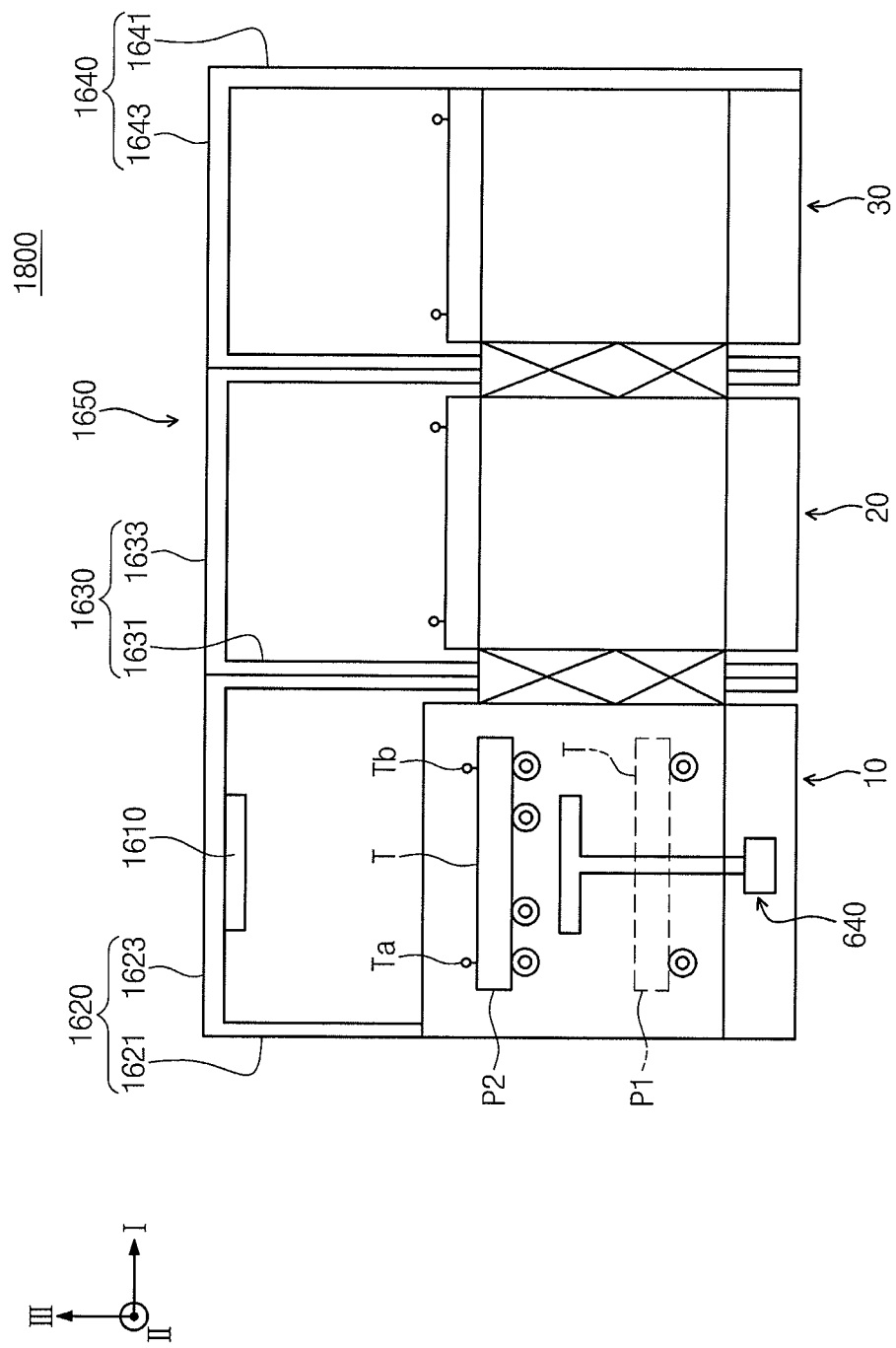
FIGS. 18A and 18B illustrate a layout according to still another example of the substrate treating apparatus of FIG. 16A.
Figure 18B:
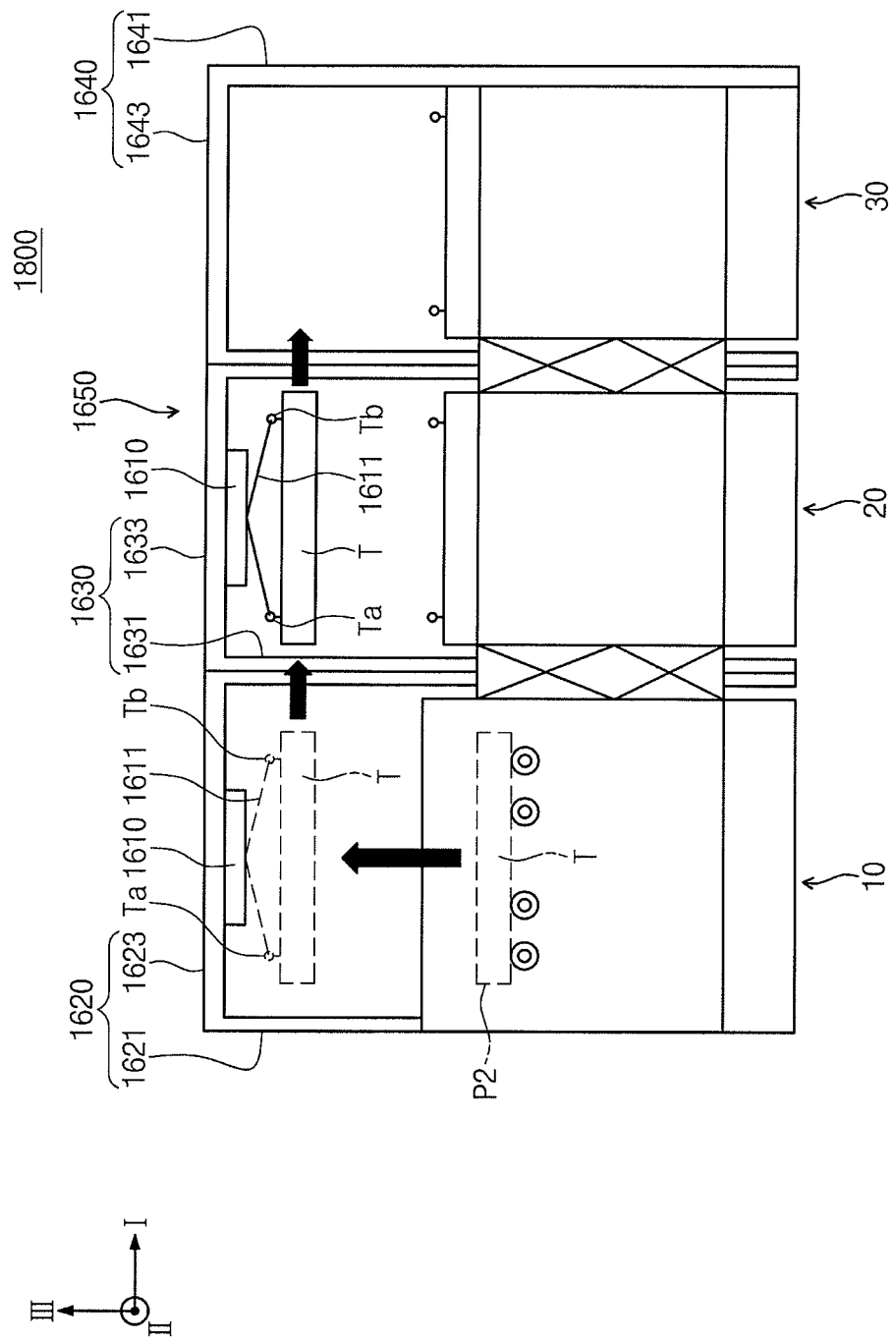

FIGS. 18A and 18B illustrate a layout according to still another example of the substrate treating apparatus of FIG. 16A. A process of inspecting units constituting a substrate treating apparatus 1800 will be described below with reference to FIGS. 18A and 18B.

First, an operator positions the crane unit 1610 to the first upper frame section 1623. The operator elevates the tray (T) from a first position (P1) to a second position (P2) by using a tray lifter 640. The operator connects connecting members (Ta and Tb) to the tray (T). The connecting members (Ta and Tb) may be provided in an eye bolt. The operator connects the crane unit 1610 with the connecting members (Ta and Tb) through the chain 1611. The operator moves the crane unit 1610 in a first direction (I) to unload the tray (T) from the substrate treating apparatus 1800. Thereafter, the operator inspects the tray (T) or the loading/unloading unit 10. At this time, in the case where the holding section 1625 is provided to the second frame section 1630 as illustrated in FIG. 16A, the operator may place the tray (T) on the holding section 1625. Alternatively, in the case where the holding section 1725 is provided to the third frame section 1640 as illustrated in FIG. 17A, the operator may place the tray (T) on the holding section 1725.

According to embodiments of the present invention, a substrate is effectively transferred among a plurality of units, thus leading to an increase in process efficiency.

In addition, according to embodiments of the present invention, it is possible to perform maintenance on a substrate treating apparatus.

Furthermore, according to embodiments of the present invention, the transfer and transport of the substrate are performed inside each unit so that a processing time can be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
a loading/unloading unit;
a process unit in which a substrate treating process is performed;
a loadlock unit disposed between the loading/unloading unit and the process unit; and
a carrying member transferring a substrate between the process unit and the loadlock unit,
wherein the carrying member is provided in the process unit and the loadlock unit,
wherein the loading/unloading unit, the loadlock unit, and the process unit are sequentially disposed,
wherein the carrying member comprises:
a first transfer unit provided in each of the loadlock unit and the process unit, the first transfer unit in the loadlock unit and the first transfer unit in the process unit having the same height; and
a second transfer unit provided in each of the loadlock unit and the process unit, the second transfer unit in the loadlock unit and the second transfer unit in the process unit having the same height,
wherein the second transfer unit is provided at a lower position than the first transfer unit,
wherein the first transfer unit comprises:
a first transfer module provided in a first treating room of the loadlock unit; and
a loading module provided in the process unit and with the same height as the first transfer module,
wherein the second transfer unit comprises:
a second transfer module provided in a second treating room of the loadlock unit; and
an unloading module provided in the process unit and with the same height as the second transfer module, and
wherein the first treating room and the second treating room are vertically partitioned in the loadlock unit.

2. The substrate treating apparatus of claim 1,
wherein the loading module comprises:
a first transfer member provided with the same height as the first transfer module;
and
a first driving member providing a driving force to the first transfer member, and
wherein the unloading module comprises:
a second transfer member provided with the same height as the second transfer module; and
a second driving member providing a driving force to the second transfer member.

3. The substrate treating apparatus of claim 2,
wherein the first transfer member comprises:
a driving shaft passing through a sidewall of a treating chamber of the process unit;
a feeding roller provided to one end of the driving shaft to support a lower side of the substrate loaded into the treating chamber;
a driven pulley provided to the other end of the driving shaft; and
a sealing mechanism tightly coupled to an outer surface of the sidewall of the treating chamber and provided such that the driving shaft is inserted and is movable in a rotational or axial direction,
wherein the first driving member comprises:
a power transmission shaft;
a driver provided to one end of the power transmission shaft to provide a rotational force; and
a drive pulley provided to the other end of the power transmission shaft, and
wherein the driven pulley and the drive pulley are coupled to each other by a power transmission member such that the driving force generated from the first driving member is transmitted to the first transfer member.

4. The substrate treating apparatus of claim 3,
wherein the second transfer member comprises:
a driving shaft passing through a sidewall of a treating chamber of the process unit;
a feeding roller provided to one end of the driving shaft to support a lower side of the substrate unloaded from the treating chamber; and
a driven pulley provided to the other end of the driving shaft,
wherein the second driving member comprises:
a driving shaft;
a driver provided to one end of the driving shaft to provide a rotational force; and
a drive pulley provided to the other end of the driving shaft, and
wherein the driven pulley and the drive pulley are connected by a power transmission member such that the driving force generated from the second driving member is transmitted to the second transfer member.

5. The substrate treating apparatus of claim 3, wherein the sealing mechanism includes a magnetic substance provided on an inner surface thereof, and a magnetic fluid provided between the magnetic substance and an outer surface of the driving shaft, and
wherein the magnetic fluid is magnetically induced by a magnetic force generated from the magnetic substance to seal a gap between the magnetic substance and the driving shaft.

6. The substrate treating apparatus of claim 3, wherein the first transfer member comprises:
a movable plate disposed between the driven pulley and the sealing mechanism;
a bearing member provided to the movable plate to rotatably support the driving shaft; and
a driving section configured to move the movable plate in a horizontal direction.

7. The substrate treating apparatus of claim 6, wherein the first driving member comprises:
a rotational shaft coupled to the driver;
a connecting shaft connecting the rotational shaft and the power transmission shaft;
a supporting plate into which the connecting shaft is rotatably inserted; and
a driving section configured to move the supporting plate in the horizontal direction.

8. The substrate treating apparatus of claim 1, wherein the loadlock unit further comprises a partition wall partitioning the loadlock unit into the first treating room and the second treating room.

9. The substrate treating apparatus of claim 1, wherein the loadlock unit further comprises:
a first heater provided in the loadlock unit and disposed above the first transfer module; and
a second heater disposed between the first transfer module and the second transfer module.

10. The substrate treating apparatus of claim 1, wherein the process unit comprises:
a first process unit in which a first process is performed on the substrate; and a second process unit which is disposed adjacent to the first process unit, in which a second process is performed on the substrate, and wherein the first process unit and the second process unit are sequentially disposed.

11. A substrate treating apparatus comprising:
a loading/unloading unit;
a process unit in which a substrate treating process is performed;
a loadlock unit disposed between the loading/unloading unit and the process unit; and
a carrying member transferring a substrate between the process unit and the loadlock unit,
wherein the carrying member is provided in the process unit and the loadlock unit,
wherein the loading/unloading unit, the loadlock unit, and the process unit are sequentially disposed, and
wherein the loading/unloading unit comprises:
 a tray carrying section carrying a tray in which the substrate is loaded or unloaded;
 a substrate loading conveyor section in which the substrates to be supplied to the tray are arranged in one row;
 a first substrate carrying robot picking up the substrate standing by in the substrate loading conveyor section to the tray positioned at the tray carrying section; and
 a second substrate carrying robot picking up the substrate from the tray positioned at the tray carrying section to carry the substrate picked up to the substrate unloading conveyor section,
 wherein the substrate loading conveyor section and the substrate unloading conveyor section are disposed symmetrically at both sides of the tray carrying section.

12. The substrate treating apparatus of claim 11, wherein the loading/unloading unit further comprises a cassette loading conveyor section including an upper conveyor and a lower conveyor,
wherein a cassette containing the substrate to be carried to the substrate loading conveyor section is placed on the upper conveyor, and
wherein a cassette from which the substrate has been unloaded to the substrate loading conveyor section is placed on the lower conveyor.

13. The substrate treating apparatus of claim 12, wherein the loading/unloading unit further comprises a substrate carrying section provided between the cassette loading conveyor section and the substrate loading conveyor section to carry the substrate from the cassette loading conveyor section to the substrate loading conveyor section, and
wherein the substrate carrying section comprises:
 a base plate;
 an end effector installed in the base plate and moving forwardly or backwardly in
 a direction which the substrate is carried; and
  a substrate shift module installed in the base plate to carry the substrate carried by the end effector to a conveyor of the substrate loading conveyor section.

14. The substrate treating apparatus of claim 13, wherein a vacuum holder adsorbing the substrate is provided to an end of the end effector.

15. The substrate treating apparatus of claim 11, wherein the first substrate carrying robot comprises:
a pair of transfer rails installed at both sides of an upper portion of the tray carrying section;
a movable frame movably provided in a direction along the transfer rails in one pair; and
a chuck unit installed in the movable frame.

16. The substrate treating apparatus of claim 15, wherein the chuck unit comprises:
a Bernoulli chuck holding an upper surface of the substrate in a non-contact state;
a supporting frame in which the Bernoulli chuck is installed; and
an elevation driver moving the supporting frame up and down.

17. The substrate treating apparatus of claim 11, wherein the tray carrying section comprises:
an upper feeding roller disposed apart from the tray in parallel to a carrying direction of the tray to carry the tray carried into the loadlock unit;
a lower feeding roller disposed apart from the tray in parallel to the carrying direction of the tray under the upper feeding roller to carry the tray carried out of the loadlock unit;
an open driving section moving the upper feeding roller in a horizontal direction; and
a tray lifter lifting the tray placed on the lower feeding roller.

18. The substrate treating apparatus of claim 11, further comprising:
a crane unit provided to an upper side of the loading/unloading unit, the loadlock unit, or the process unit;
a frame section supporting the crane unit; and
a driving unit installed in the frame section to drive the crane unit,
wherein the crane unit is provided for maintenance of the loading/unloading unit, the loadlock unit, or the process unit.

19. The substrate treating apparatus of claim 18, wherein the frame section comprises:
a first frame section disposed above the loading/unloading unit;
a second frame section disposed above the loadlock unit;
a third frame section disposed above the process unit;
a fourth frame section disposed adjacent to the third frame section; and
a holding section provided to either the first frame section or the second frame section, on which either a process unit lead opening/closing the process unit or a loadlock unit lead opening/closing the loadlock unit is placed.

20. The substrate treating apparatus of claim 19, wherein the process unit lead, the loadlock unit lead, or a holding unit holding a supporting unit separated from the process unit are further disposed in the fourth frame section.

21. The substrate treating apparatus of claim 20, wherein the holding unit comprises:
a body section;
a hole formed downwardly from an upper surface of the body section; and
a moving means coupled to an undersurface of the body section.

22. A substrate treating apparatus comprising:
a loading/unloading unit;
a process unit in which a substrate treating process is performed;
a loadlock unit disposed between the loading/unloading unit and the process unit;
a carrying member transferring a substrate between the process unit and the loadlock unit;
a crane unit provided to an upper side of the loading/unloading unit, the loadlock unit, or the process unit;

a frame section supporting the crane unit; and
a driving unit installed in the frame section to drive the crane unit,
wherein the carrying member is provided in the process unit and the loadlock unit,
wherein the loading/unloading unit, the loadlock unit, and the process unit are sequentially disposed,
wherein the crane unit is provided for maintenance of the loading/unloading unit, the loadlock unit, or the process unit,
wherein the frame section comprises:
  a first frame section disposed above the loading/unloading unit;
  a second frame section disposed above the loadlock unit;
  a third frame section disposed above the process unit;
  a fourth frame section disposed adjacent to the third frame section; and
  a holding section provided to either the first frame section or the second frame section, on which either a process unit lead opening/closing the process unit or a loadlock unit lead opening/closing the loadlock unit is placed,
wherein the process unit lead, the loadlock unit lead, or a holding unit holding a supporting unit separated from the process unit are further disposed in the fourth frame section,
wherein the holding unit comprises:
  a body section;
  a hole formed downwardly from an upper surface of the body section; and
  a moving means coupled to an undersurface of the body section, and
wherein the body section comprises:
  an upper frame contacting and supporting the supporting unit at a lower side of the supporting unit;
  side frames vertically extending in a downward direction from edges of the upper frame; and
  a lower frame provided in parallel with the upper frame at lower ends of the side frames.

* * * * *